United States Patent [19]

Graham et al.

[11] Patent Number: 5,072,195

[45] Date of Patent: Dec. 10, 1991

[54] PHASE-LOCKED LOOP WITH CLAMPED VOLTAGE-CONTROLLED OSCILLATOR

[75] Inventors: Andrew C. Graham, Sunnyvale; Mark E. Fitzpatrick; Wei Chen, both of San Jose, all of Calif.

[73] Assignee: Gazelle Microcircuits, Inc., Santa Clara, Calif.

[21] Appl. No.: 505,851

[22] Filed: Apr. 5, 1990

[51] Int. Cl.[5] .................... H03L 7/093; H03L 7/23
[52] U.S. Cl. ........................ 331/2; 331/1 A; 331/11; 331/25; 331/27; 307/516; 328/133
[58] Field of Search ................ 331/2, 11, 25, 27, 1 A

[56] References Cited

U.S. PATENT DOCUMENTS

| | | | |
|---|---|---|---|
| 4,131,861 | 12/1978 | Malaviya | 331/2 |
| 4,516,084 | 5/1985 | Crowley | 331/2 |
| 4,567,448 | 1/1986 | Ikeda | 331/2 X |

OTHER PUBLICATIONS

Motorola MECL data book, copyrighted 1983, pp. 7-25 to 7-29.

Primary Examiner—Siegfried H. Grimm
Attorney, Agent, or Firm—Skjerven, Morrill, MacPherson, Franklin & Friel

[57] ABSTRACT

A phase-locked loop responsive to both phase and frequency difference between the incoming and the feedback signal is provided. Using a reference signal, this phase-locked loop accepts a wide range of requencies similar to a phase-locked loop having a phase frequency detector, and also achieves the noise performance of a phase-locked loop having only a simple phase detector. In one embodiment, the phase-locked loop is a combination including first and second phase-locked loops. The reference signal is provided to the first phase-locked loop, which includes a phase frequency detector. This first phase-locked loop is used to control a second phase-locked loop, which includes a phase detector. A voltage clamp can also be provided to enhance the ability to lock a signal among several signals, or from a noisy background.

25 Claims, 16 Drawing Sheets

Down = $V_{in} \circ V_{fb}$     Up = $V_{in} \circ \overline{V_{fb}}$

| $V_{fb}$ | $V_{in}$ | $V_{Up}$ | $V_{Down}$ |
|---|---|---|---|
| 0 | 0 | 0 | 0 |
| 0 | 1 | 1 | 0 |
| 1 | 0 | 0 | 0 |
| 1 | 1 | 0 | 1 |

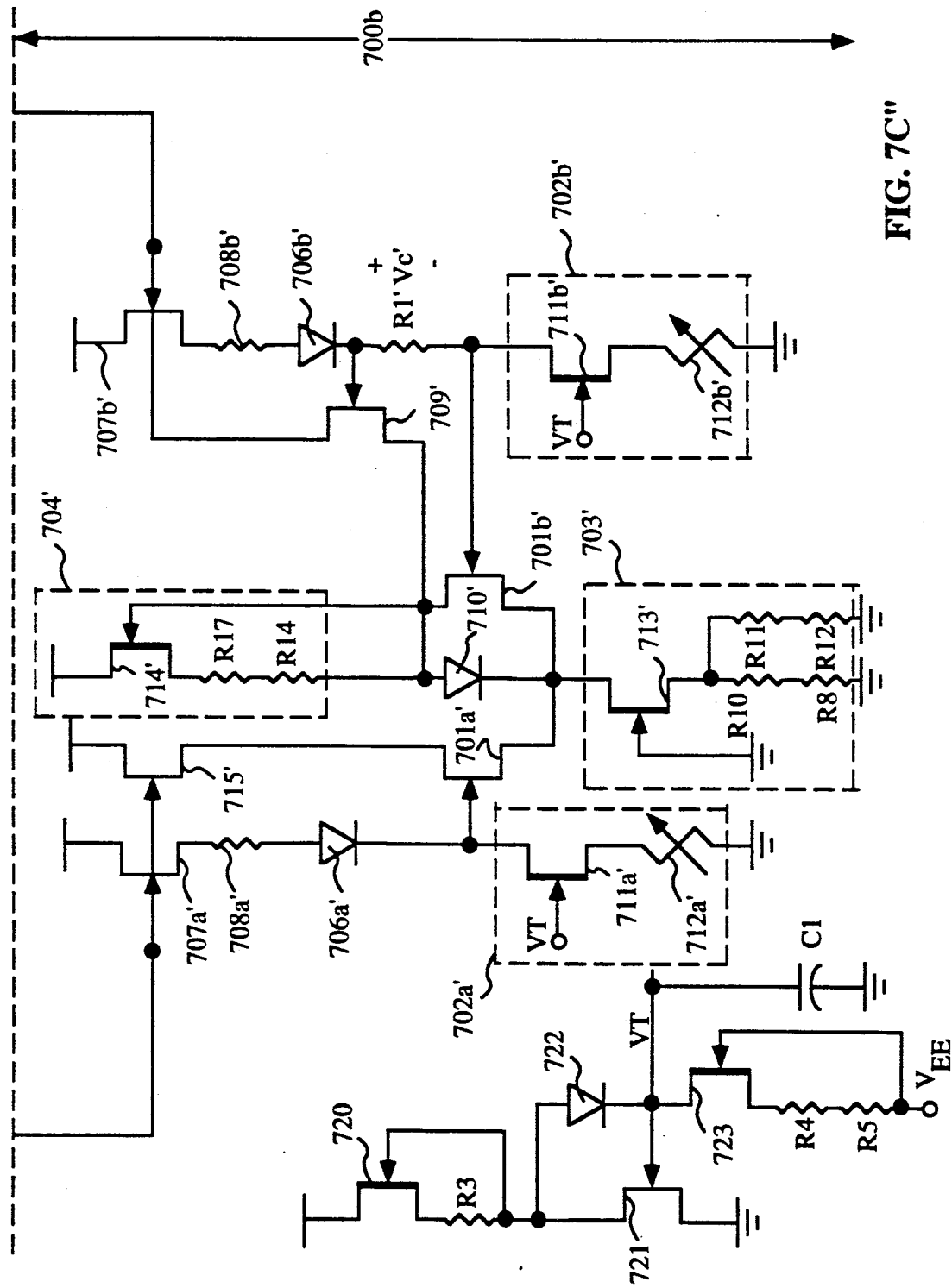
FIG. 7C"

PHASE-LOCKED LOOP WITH CLAMPED VOLTAGE-CONTROLLED OSCILLATOR

CROSS-REFERENCE TO RELATED APPLICATIONS

The following co-pending applications are assigned to the same assignee of the present application and are related to the present application:

a. "Current Pump Structure" by Mark Fitzpatrick et al., filed concurrently herewith and assigned Serial No. 07/506,418;

b. "Floating Transistor Switch" by Mark Fitzpatrick et al., filed concurrently herewith and assigned Ser. No. 07/505,858, which was issued on Apr. 2, 1991 as U.S. Pat. No. 5,004,971;

c. "New Phase/Frequency Detector" by Robert Burd et al., filed concurrently herewith and assigned Ser. No. 07/505,856;

d. "Circuit and Method for Extracting Clock Signal from a Serial Data Stream" by Andrew C. Graham et al., filed concurrently herewith and assigned Ser. No. 07/505,857; and e. "Phase Detector Implemented With Diode Logic" by Andrew Graham et al., filed concurrently herewith and assigned Ser. No. 07,505,306.

The disclosures of these concurrently filed applications are incorporated herein by reference.

1. Background of the Invention

This invention relates to the design of phase-locked loops; and, in particular, relates to the design of phase-locked loops sensitive to frequency errors.

2. Description of the Prior Art

Phase-locked loops find wide applications in communication and signal processing, such as in recovering an encoded signal embedded in a carrier. A phase-locked loop provides an output signal related to the input signal by a fixed frequency or phase relationship. The output signal may be the same or a harmonic signal.

A typical configuration of a phase-locked loop is shown in FIG. 1a. As shown in FIG. 1a, this phase-locked loop comprises a phase detector stage 100, a filter stage 101, and a voltage-controlled oscillator stage 102. The input signal $V_{in}$ is provided at the phase detector stage 100. The output signal $V_{out}$ of the voltage-controlled oscillator 102, can also be the output signal of the phase-locked loop. This output signal $V_{out}$ is fed back to the phase detector stage 100. In many applications, where it is desired to have the phase-locked loop's output signal frequency to be an integral multiple (N) of the input signal's frequency, a divide-by-N counter 103 is used to divide the feedback output signal $V_{out}$ to the input's signal frequency before feeding back as $V_{out'}$ into the phase detector stage 100. This optional divide-by-N counter 103 is also shown in FIG. 1a.

The phase detector 100 provides as output signal $V_\Phi$ a waveform which is related to the phase difference between the input signal $V_{in}$ and the feedback signal $V_{out'}$ ($V_\Phi = K\Phi(\theta_i - \theta_{fb})$), where $\theta_i$ and $\theta_{fb}$ are the phase angles of the input signal $V_{in}$ and the feedback signal $V_{out'}$ respectively. In some phase detectors, each phase detector provides two outputs "up" and "down", corresponding to results of two logic functions applied to the input feedback signal $V_{out'}$ and the input signal $V_{in}$, where the amount of time of the up signal in the active state relative to the amount of time of the down signal in the active state indicates whether the feedback signal $V_{out'}$ is leading or lagging input signal $V_{in}$. In some embodiments, such as shown in FIG. 1b, charge pump circuits are provided to convert the up and down signals to a current waveform at the output of charge pump 104. This current waveform is then integrated to become a voltage waveform $V_a$ as shown at the output of filter 101. Alternatively, the up and down signals may be provided to the filter stage 101.

The filter stage 101 provides a time-average voltage level $V_a$ of the difference waveform $V_\Phi$. Or, if the up and down signals are provided instead $V_\Phi$, the filter stage 101 will also perform signal processing for the up and down signals. The signal processing in filter stage 101 is similar to that described above in the phase detector 100 for such signals. This time-average voltage level $V_a$ is a correction signal to the voltage-controlled oscillator 102 to adjust the phase of the output signal $V_{out}$. FIGS. 1a and 1b each show the frequency $f_{out}$ of the output voltage $V_{out}$ being proportional to its input signal $V_a$, and centered around a principal frequency $f_0$.

There are many kinds of phase detector circuits known in the art, some are sensitive only to the difference in phase between the input and the feedback signals, and others are sensitive to both phase and frequency differences in the input and feedback signals. Two examples of phase detector circuits may be found in the part MC4344/4044, shown at page 7-25 of the Motorola MECL data book, copyrighted 1983, series D, hereby incorporated by reference in its entirety. In MC4344/4044, there are two different phase detector circuits, referred to as phase frequency detector number 1, and phase detector number 2. (In the diagram shown at page 7-25 of the above reference, both phase detectors are labelled phase frequency detectors. This is a misnomer, since phase detector number 2 is not sensitive to frequency variations.) Phase frequency detector number 1 is a sequential circuit having an output signal proportional not only to the phase difference of the two input signals $V_{in}$ and $V_{out'}$, but also to the frequency difference of these input signals as well. Phase detector number 2 is a combinatorial logic circuit, and is strictly a phase detector and is unable to respond to frequency difference with a consistent average output voltage level. In fact, the averaged output signal alternates between high and low levels at a rate related to the frequency difference (i.e. a beat note).

FIG. 2a shows an active high logic gate 200 being used as a phase detector. This logic gate 200 belongs to the class of "quadrature" phase detectors, since the phase detector "locks" on to the input voltage waveform 90 degrees out of phase. The phase detector 200 provides two outputs, labelled respectively "up" and "down". Both outputs (up and down) may be fed into a filter circuit which, in turn, provides a correction signal corresponding to the relative strengths (see below) of the up and down signals. This correction signal directs the voltage-controlled oscillator to provide an output having a higher or lower frequency in the output feedback signal, as the case may be. A truth table is included in FIG. 1a' to show the output logic values $V_{Up}$ and $V_{Down}$ in phase detector 200 in response to the input logic values $V_{fb}$ and $V_{in}$.

FIG. 2b shows the operations of the phase detector under the conditions at which the feedback voltage waveform is leading, tracking or lagging the locking condition.

The input voltage waveform $V_{in}$ is shown at the top of FIG. 2b. The feedback voltage waveform $V_{fb1}$ illustrates the condition in which the feedback signal $V_{fb1}$ leads the input signal $V_{in}$ by $\theta_e$. Under the leading condition, the feedback voltage waveform $V_{fb1}$ is $(90-\theta_e)$ degrees out of phase with the input voltage waveform $V_{in}$. The output of the phase detector 200 yields the voltage waveforms labelled $V_{up1}$ and $V_{down1}$. In this instance, the percentage of time at active high for $V_{up1}$ is smaller than the percentage of time at active high for $V_{down1}$, i.e. the time-average voltage of $V_{up1}$ is smaller than the time-average voltage of $V_{down1}$; in other words, the down output of the phase detector 200 is relatively stronger than its up output. The VCO will be directed to provide an output with a lower frequency (down) in order to minimize the phase difference between $V_{in}$ and $V_{fb1}$.

The feedback voltage waveform $V_{fb2}$ illustrates a feedback waveform in quadrature lock condition with the input waveform $V_{in}$. The output voltage waveforms $V_{up2}$ and $V_{down2}$ of this phase detector 200 are at logic high substantially the same percentage of time. Therefore, the filter output signal $V_a$ to the voltage controlled oscillator will tend to maintain the output of the voltage-controlled oscillator at the current frequency.

The feedback voltage waveform $V_{fb3}$ illustrates a feedback waveform lagging the quadrature lock condition by a phase of $\theta_e$. The output voltage waveform $V_{up3}$ of this phase detector 200 has a higher percentage of time in the active high state than the output waveform $V_{down3}$, hence the relative strength of the output signal at the up output of the phase detector is stronger than the output signal at the down output of the phase detector. Under this condition, the filter output signal $V_a$ at filter stage 101 will drive the voltage-controlled oscillator 102 to increase the frequency of the feedback signal $V_{fb3}$ until signal $V_{fb3}$ is in quadrature lock relationship with the input signal $V_{in}$ again.

FIG. 3 shows another phase detector 300, which comprises a sequential circuit. The output voltage waveforms up and down of this phase detector are dependent not only on the difference in phase between the input signal $V_{in}$ and the feedback signal $V_{fb}$, but are also dependent on the difference in frequency between these same signals $V_{in}$ and $V_{fb}$. The type of phase detectors which are sensitive both to phase and frequency, such as phase detector 300, is usually known as phase frequency detectors. A detailed discussion of the operation of this phase detector 300 may be found at pages 7-27 to 7-28 in the Motorola MECL data book referenced above. The detailed operation of this phase detector 300 is known in the art, and is therefore not repeated here.

A phase-locked loop using strictly a phase detector (i.e. a detector of the type not sensitive to frequency differences), may be unable to lock on a signal $V_{in}$ if the frequency of the initial feedback signal $V_{fb}$ of the voltage-controlled oscillator (VCO) is very different from the input signal $V_{in}$. This is because the phase detector, being insensitive to the frequency difference between the input signal $V_{in}$ and the feedback signal $V_{fb}$, does not provide a frequency correction signal to the VCO to pull the two signals closer to each other. The range of the frequencies in which a phase-locked loop is able to lock an input signal $V_{in}$, when the phase-locked loop is not initially locked, is known as the "pull-in" range. The pull-in range of a phase-locked loop having only a strict phase detector is often limited; such a loop will often only lock an incoming signal $V_{in}$ if the initial frequency of the VCO deviates within a narrow range of the incoming signal. An analysis of the pull-in process for a phase-locked loop having only a strict phase detector may be found in Appendix A of the book "Phase-locked Loops" by Dr. Roland E. Best, published by McGraw Hill Inc., New York (1984), hereby incorporated by reference in its entirety.

On the other hand, if the phase detector used in a phase-locked loop has a frequency sensitivity (i.e. a phase frequency detector), the pull-in range of the phase-locked loop is greatly enhanced to allow locking of signals over a wide range of frequencies, provided a wide range VCO is used. A phase frequency detector always provides a correction signal to drive the VCO in the direction in which the frequency error is reduced even if the difference in frequency between the input signal $V_{in}$ and the feedback signal $V_{fb}$ is large. This signal assumes a phase correction character as the frequency difference between the incoming signal $V_{in}$ and the feedback signal $V_{fb}$ narrows. A phase-locked loop using a phase frequency detector can hence tolerate an initial wide variation in frequency. In fact, as long as the incoming signal $V_{in}$ is within the signal range of the VCO, locking is almost certain to happen; that is, the pull-in range of such a phase-locked loop is essentially the range of the VCO. (Of course, if a divide-by-N counter is interposed between in the feedback signal, the pull-in range will be essentially the range of the VCO divided by N).

However, as can be seen by a comparison between FIGS. 2a and 3, a strict phase detector is much simpler in structure. There are numerous occasions when a strict phase detector is preferable to a phase frequency detector. The strict phase detector may have no feedback in the circuit, and hence a much shorter critical-path gate delay. As a result, the strict phase detector may operate at a much higher frequency, if its narrow pull-in range can be tolerated. Furthermore, the strict phase detector has a superior noise performance over the phase frequency detector. For example, if the incoming signal to be locked is mixed with a number of signals of different frequencies, or its signal level is low relative to the noise of the environment, a phase detector having no frequency correction performs significantly better than a phase frequency detector which may often track the undesired signals, or may not obtain lock on any signal at all.

FIG. 4 shows a signal in an application particularly suited for a phase detector with no frequency sensitivity. The waveform shown in FIG. 4 is a clock signal with embedded data using a pulse encoding scheme. The clock signal is made up of regular transitions, such as those shown during the time period T1, which are interrupted by the encoding data. For example, time periods T2, T4 and T6 are such data embedded periods, and time periods T1, T3 and T5 are periods of regular transition. When provided with this signal as input, a phase-locked loop using a phase frequency detector will most likely lock on to an average frequency, if it locks at all, rather than the desired clock frequency of regular transitions. However, a phase-locked loop having the strict phase detector could ignore the time periods of no transition (e.g. time periods T2, T4 and T6), and lock on to the clock signal.

Being unable to provide a frequency correction signal, a strict phase detector can lock on to a harmonic frequency. When the feedback signal is a harmonic and in phase with the harmonic component of the incoming signal, the phase-locked loop may operate at the harmonic, even if there is no noise in the environment. A phase frequency detector in this situation will be able to provide a correction signal to adjust the VCO to lock the incoming signal at the correct frequency.

Hence, the two types of phase detectors discussed above are favored in different applications. It would be, however, very desirable to have a phase detector circuit being able to lock onto a wide range of frequencies, but at the same time having the advantages of a simple phase detector, i.e. the ability to extract a clock signal from embedded data or surrounding noise, or from a signal mixed in with signals of a multitude of frequencies etc. Such a phase detector is useful in a tuner for T.V. signal, for example; or for recovering clock and data signals from a pulse train whose carrier frequency might take on a number of values. In general, a manufacturer of the phase-locked loops may desire to offer to customers one phase-locked loop capable of operating over a range of frequencies, e.g. a two-to-one range, and allow the customer the flexibility of selecting from that range a particular frequency to operate the phase-locked loop. Furthermore, it is desirable to provide a phase-locked loop, with the advantages of a narrow pull-in range of a strict phase detector, which can be tuned to lock an incoming signal of a frequency to be determined at the time of use, rather than at the time of design.

In the prior art, a narrow range phase-locked loop allowing the customer to set an operating frequency at the time of use may be achieved by requiring the use of external components to tune the VCO to a center frequency at the center of the customer's range of frequencies. These external components are typically a resistor, an inductor, a capacitor, or a combination of two or more of these components. It is up to the customer to provide carefully chosen external components to achieve the desired operating frequency. Often, the customer may have to go through some experimentation, or obtain precisely calibrated components, in order to achieve the frequency which is the center of his range. Furthermore, the external components are often critical to the timing of the VCO itself. In high frequency applications, having external components causes problems. In fact, as the external components to a phase-locked loop in an integrated circuit package are connected to the integrated circuit by the lead frame and bonding wires, the integrated circuit may become susceptible to the noise on the circuit board, or from adjacent pins in the package. The effects on the sensitive VCO circuit include undesirable jitter or phase noise. If the noise is caused by output switching in the various outputs of the integrated circuit, under certain conditions, the phase-locked loop may lose its lock on the signal.

SUMMARY OF THE INVENTION

In accordance with the present invention, a phase-locked loop is provided comprising a reference phase-locked loop using a user-provided reference frequency, in combination of a recovery phase-locked loop having a strict phase detector. The phase-locked loop in accordance to the present invention achieves the superior noise performance and narrow lock range of a strict phase detector phase-locked loop and possesses, at the same time, the ability to accept a wide range of input frequencies, as in a phase frequency detector phase-locked loop.

In accordance with the present invention also, a voltage clamp between the reference phase frequency detector phase-locked loop and the strict phase detector phase-locked loop is provided to restrict the strict phase detector phase-locked loop from locking on strong harmonics, and to help it acquire lock on frequencies near a center frequency established by the reference phase-locked loop.

BRIEF DESCRIPTION OF THE DRAWINGS

FIG. 2a' is a truth table showing the output logic states of the logic gate phase detector shown in FIG. 2a.

FIG. 7c, show another embodiment of a voltage clamp circuit in accordance with the present invention.

DETAILED DESCRIPTION

For the sake of consistency and simplicity, in the following description active high logic will be used throughout the rest of the description. Similarly, voltage levels are assumed to be relative to ground; and, wherever a transistor is used, a metal-semiconductor field-effect transistor (MESFET) is assumed. However, unless otherwise specified, using active high logic, relative-to-ground voltage reference and MESFETs are for example only. The skilled person will be able to, in view of the following description and accompanying drawings, utilize voltage levels relative to other power supply voltages, use active low logic elements, or use other transistors, such as bipolar transistors or MOSFETs, upon suitable modification of the circuits using techniques known in the art.

Figure 1A:
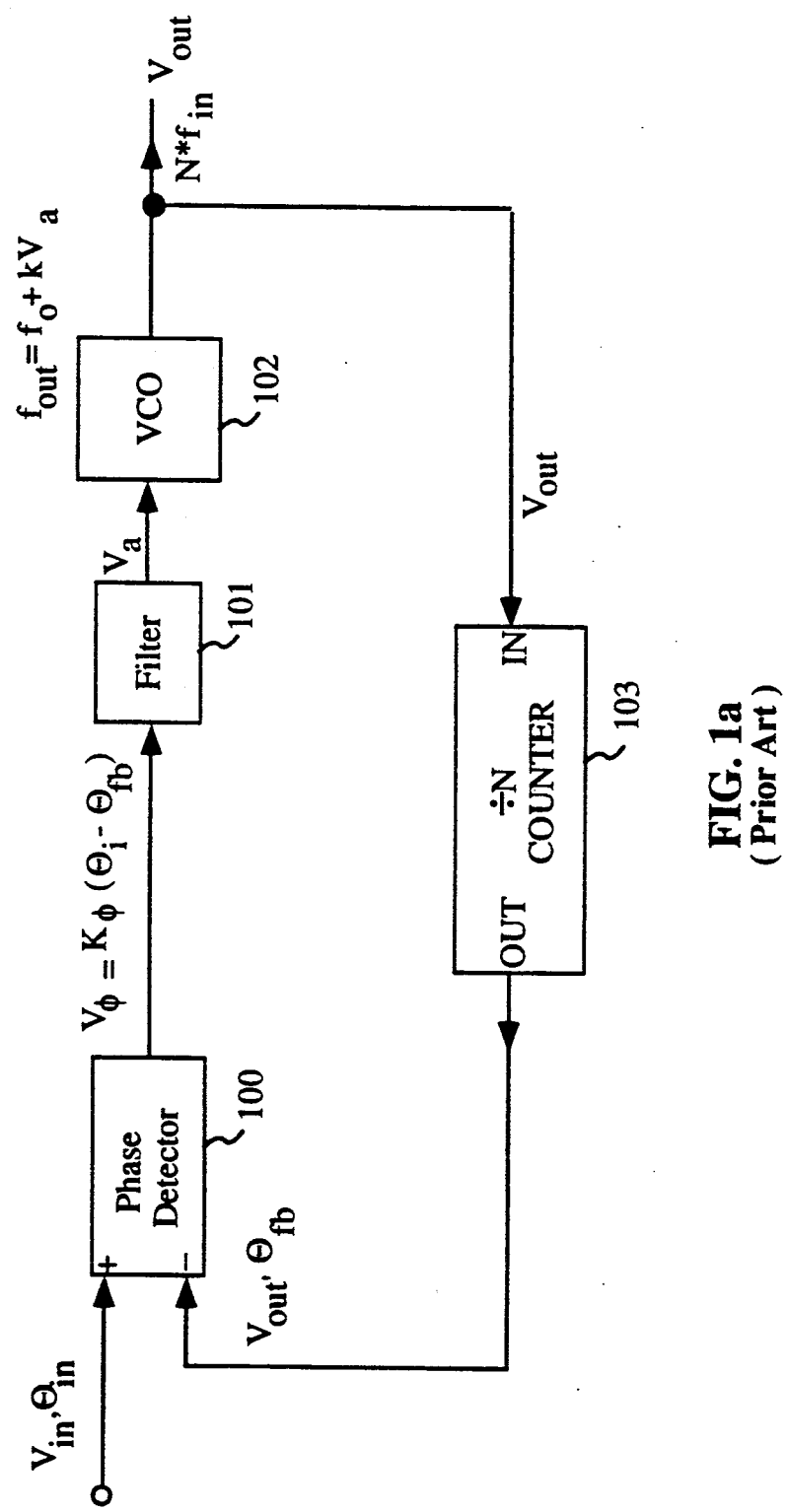
FIG. 1a shows a typical phase-locked loop in diagram form.
Figure 1B:
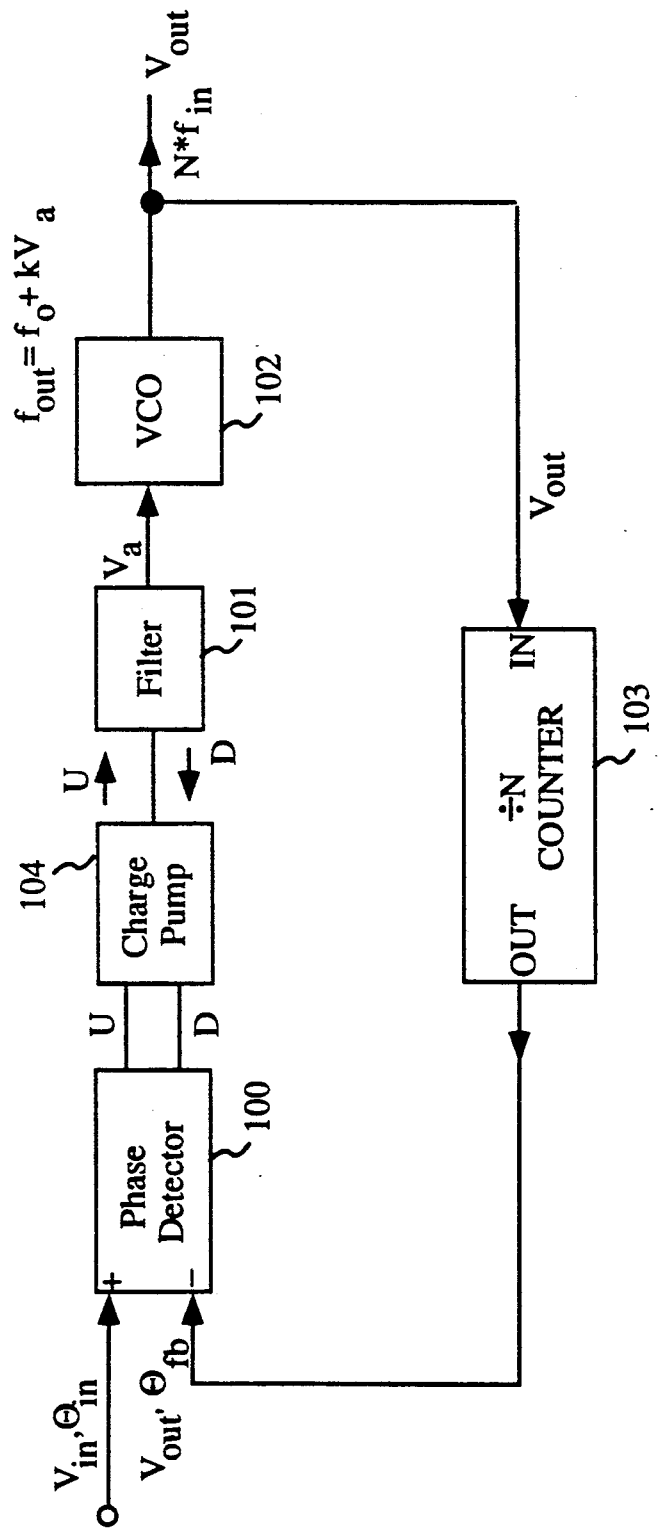
FIG. 1b shows in block diagram form an alternative implementation of a typical phase-locked loop.
Figure 5:
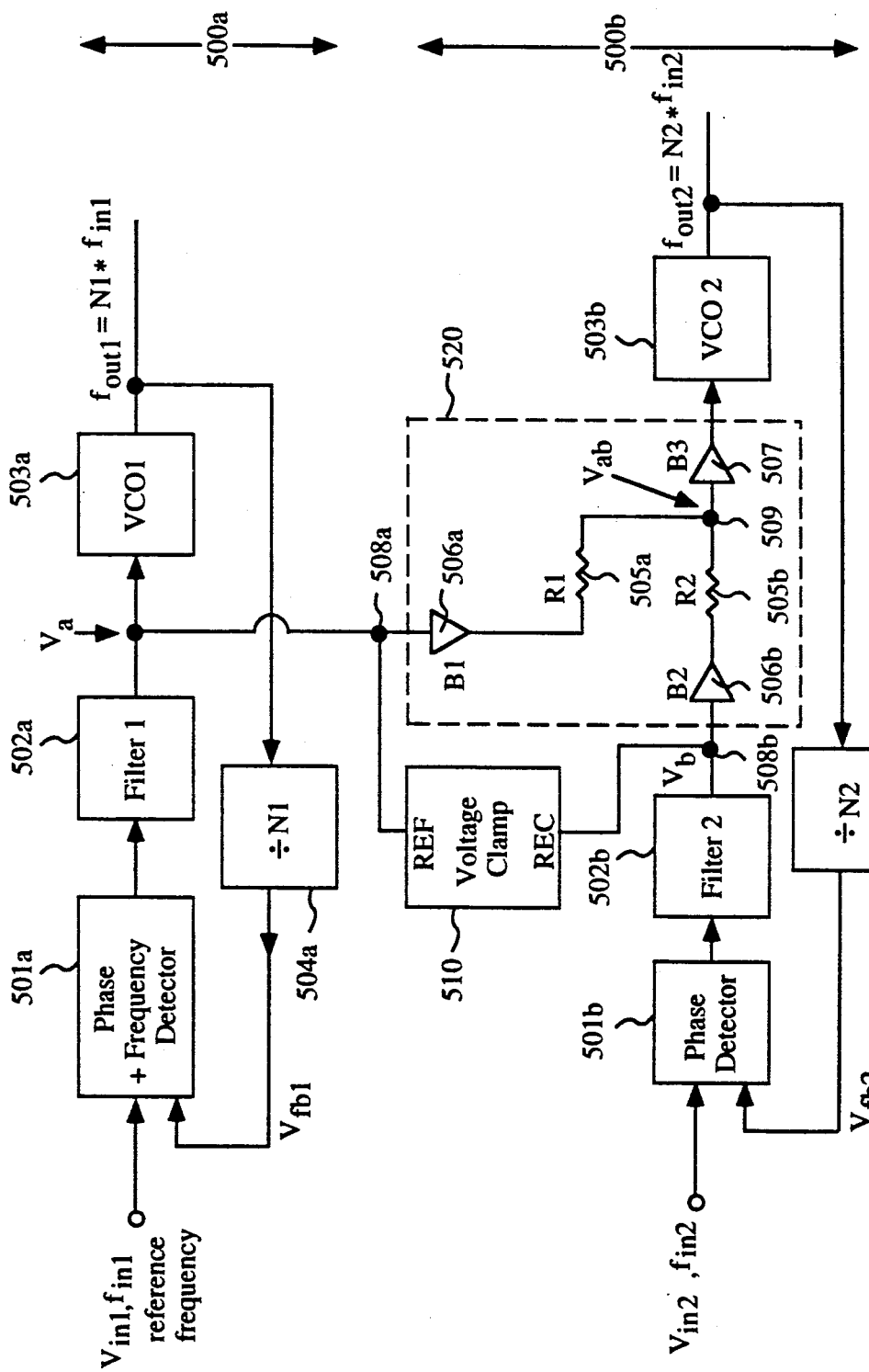
FIG. 5 shows an embodiment of a phase-locked loop in accordance to the present invention.

FIG. 5 shows an embodiment of a phase-locked loop in accordance with the present invention. The phase-locked loop shown in FIG. 5 comprises two component phase-locked loops 500a and 500b, respectively called the "reference" phase-locked loop and the "recovery" phase-locked loop. Each phase-locked loop comprises a phase detector section (501a and 501b), a filter section (502a and 502b) and a VCO section (503a and 503b) similar to the phase-locked loop described in FIG. 1a. The optional divide-by-N counters 504a and 504b are also shown, although such counters are optional, as discussed in conjunction with FIG. 1a. The input to the reference phase-locked loop 500a is a reference signal $V_{in1}$ of the reference frequency $f_{in1}$ supplied by the user at the time of operation; this reference frequency $f_{in1}$ is related to the frequency in the incoming signal $V_{in2}$, which is close to or equal to a center frequency $f_{in2}$, about which the phase detector is expected to lock, by the relation:

$$f_{in1} = (N2/N1) * f_{in2}. \qquad (F.1)$$

Figure 3:
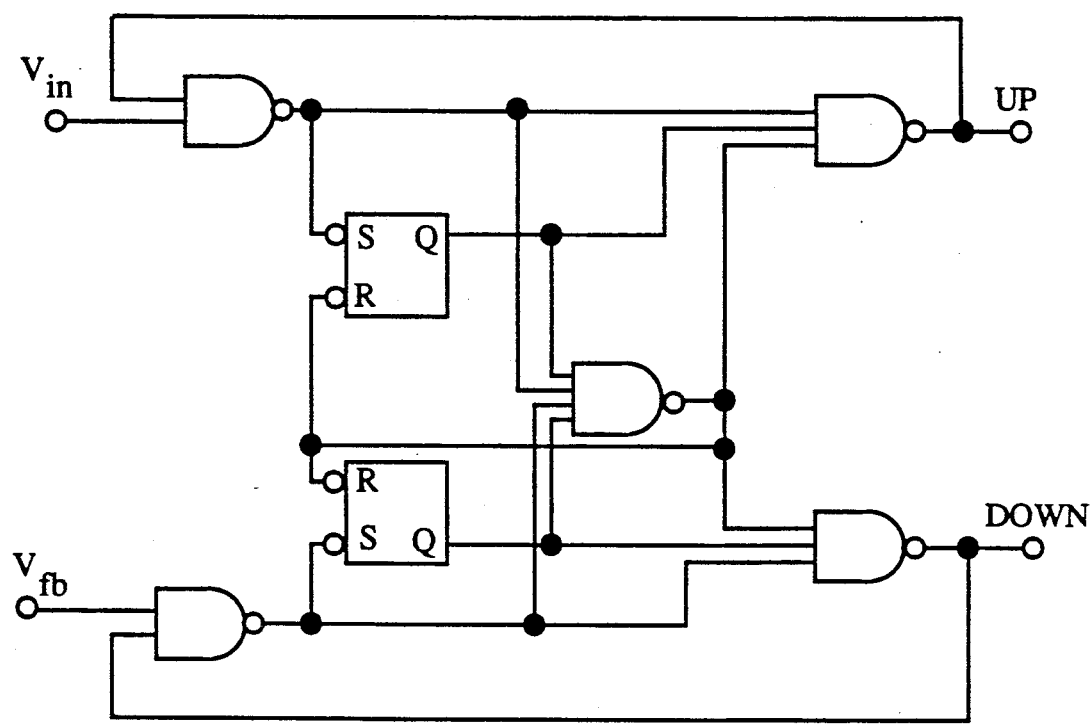
FIG. 3 shows a phase frequency detector.

In phase-locked loop 500a, the phase detector section is composed of a phase frequency detector 501a, which is responsive to both frequency and phase differences between the input signal $V_{in1}$ and $V_{fb1}$. This phase frequency detector 501a may be provided by a circuit such as that shown in FIG. 3. Recalling that the pull-in range of a phase-locked loop using a phase frequency detector is substantially the range of the VCO divided by the division factor of the feedback divide-by-N counter, the reference phase-locked loop 500a will lock on the reference signal $V_{in1}$, if the reference frequency $f_{in1}$ is within the range of VCO 503a divided by N1. In one embodiment of the present invention, the pull-in range is described as "two-to-one", i.e the maximum frequency within the range is two times the minimum frequency within the range.

The VCOs 503a and 503b in accordance with the present invention are designed to be well-matched, such that substantially identical voltage inputs at the respective VCO input terminals will result in output signals of substantially identical output frequencies. This matching may be achieved in an integrated circuit by forming the VCOs using substantially identical layout, and placing them in close proximity with each other. Other techniques for matching such circuits are also known in the art.

Figure 2A:
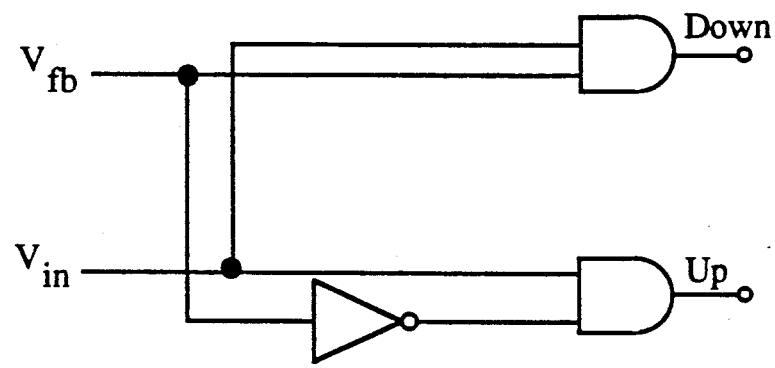
FIG. 2a shows an implementation in the prior art of a logic gate phase detector.
Figure 2B:
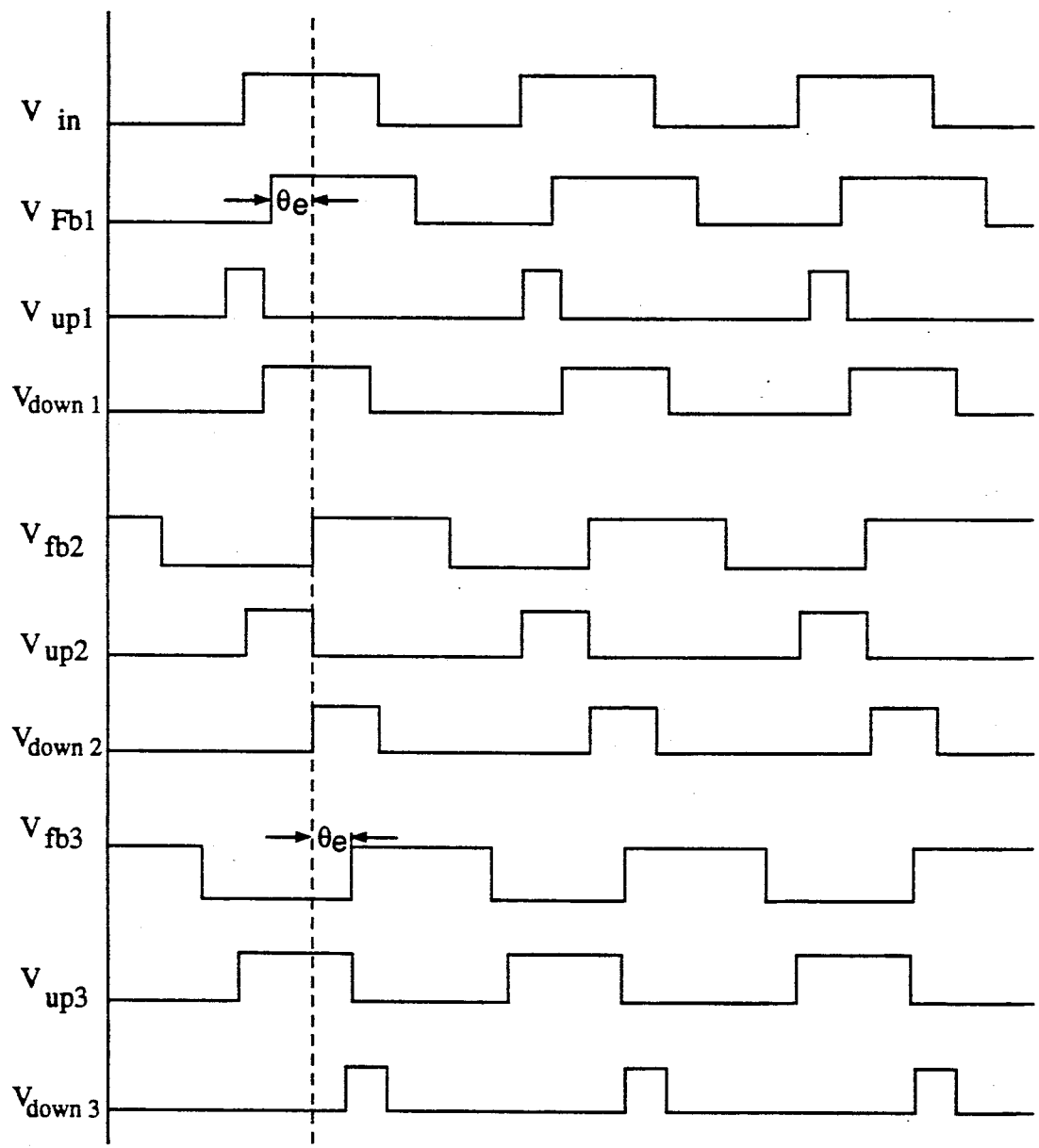
FIG. 2b shows the operation of a phase-locked loop using the logic gate phase detector shown in FIG. 2a, under leading, locking, and lagging condition.

The recovery phase-locked loop 500b has a strict phase detector 501b, not responsive to frequency differences, but having all the advantages of the strict phase detector phase-locked loop as discussed above in conjunction with FIGS. 2a and 2b. The input signal $V_{ab}$ to VCO 503b in this recovery phase-locked loop 500b is provided by summing the output signals $V_a$ and $V_b$ of the filter sections 502a and 502b in the reference phase-locked loop 500a and the recovery phase-locked loop respectively. The output signals $V_a$ and $V_b$ of the filter sections 502a and 502b respectively are combined by the summing circuit 520 comprising the resistors 505a and 505b and the buffers 506a, 506b and 507. These buffers 506a, 506b and 507 are provided for desirable isolation of the filter circuits 502a and 502b, but are in fact unnecessary for the practice of the present invention. In practice, the buffer circuits 506a, 506b and 507 may provide gain. For simplicity in the present discussion, however, a unity gain in the buffer circuits suffices.

It is evident from the summing circuit 520 shown that the voltage $V_{ab}$ at node 509 is given by:

$$V_{ab} = (R2*V_a + R1*V_b)/(R1+R2) \qquad (F.2)$$

where R1 and R2 are resistance values of the resistors 505a and 505b respectively, and $V_a$ and $V_b$ are voltages at nodes 508a and 508b respectively. Therefore, the respective resistance values R1 and R2 of resistors 505a and 505b determine the voltage at node 509. Specifically, the larger the resistance R2 relative to the resistance R1, the greater the influence of the reference phase-locked loop 500a on the recovery phase-locked loop 500b.

Therefore, if the frequency of the initial feedback signal $V_{fb2}$ of VCO 503b is significantly different from the product of the counter ratio (N1/N2) and the reference frequency $f_{in1}$ of the reference signal $V_{ref}$, the voltages $V_a$ and $V_b$ at nodes 508a and 508b will also be significantly different. The voltage $V_{ab}$ at node 509, determined by the relation F.2 above, will be a frequency correction signal to VCO 503b to pull the recovery phase-locked loop 500b to lock the portion of incoming signal $V_{in2}$ if it is at or about the reference frequency $f_{in1}$ times the counter ratio (N1/N2), even though recovery phase-locked loop 500b does not have a phase frequency detector. On the other hand, if the frequency of signal $V_{fb2}$ of the VCO 503b is close to the reference frequency $f_{in1}$ times the counter ratio (N1/N2), the voltages $V_a$ and $V_b$ at nodes 508a and 508b will be close to equal, so that the recovery phase-locked loop will lock the incoming signal $V_{in2}$, acting as if the reference and recovery phase-locked loops 500a and 500b are decoupled. Hence, the reference phase-locked loop sets a center frequency $f_{in2}$ equal to $f_{in1}$ times counter ratio (N1/N2) for the recovery phase-locked loop 500b. In fact, because the reference phase-locked loop 500a will provide a strong correction signal to the recovery phase-locked loop 500b when the reference frequency $f_{in1}$ times the counter ratio (N1/N2) is significantly different from the frequency of the incoming signal $V_{in2}$, tending to coerce the recovery phase-locked loop 500b to lock a signal close to the frequency $f_{in1}$ times the counter ratio (N1/N2), the pull-in range of the recovery phase-locked loop 500b is related to the pull-in range of the reference phase-locked loop 500a by the counter ratio (N1/N2) and the choice of resistor values R1 and R2. If R1 is much greater than R2, the influence of the reference phase-locked loop 500a upon recovery phase-locked loop 500b is more attenuated, allowing recovery phase-locked loop 500b to maintain its narrow pull-in range. It can be seen that, if R1 is chosen to be smaller in relation to R2, the influence of the reference phase-locked loop 500a is stronger, tending to coerce the recovery phase-locked loop 500b to lock even closer to the center frequency set by the reference phase-locked loop 500a. Hence, the smaller R1 will effectuate an even narrower pull-in range for the recovery phase-locked loop 500b.

In summary, it can be seen that the reference phase-locked loop 500a provides a center frequency about which the recovery phase-locked loop 500b may lock an incoming signal $V_{in2}$, while the recovery phase-locked loop 500b provides the fine tuning to lock within its narrow pull-in range, but maintaining the superior noise performance as a phase-locked loop having only simple phase detection ability.

Taken in total, the reference and recovery phase-locked loops 500a and 500b provide a phase-locked loop capable of locking a wide range of frequencies, and once a target frequency is selected within that wide range, the phase-locked loop has the advantages of a strict phase detector phase-locked loop. These advantages are realized inexpensively because the reference frequency may be provided in high accuracy using a crystal. Because the reference frequency is a digital signal, it is not particularly susceptible to noise. The sensitive analog components, such as the VCO or the filter stages, are kept entirely on-chip, thereby isolating them from both noise in the environment and output noise of the integrated circuit itself.

Figure 4:
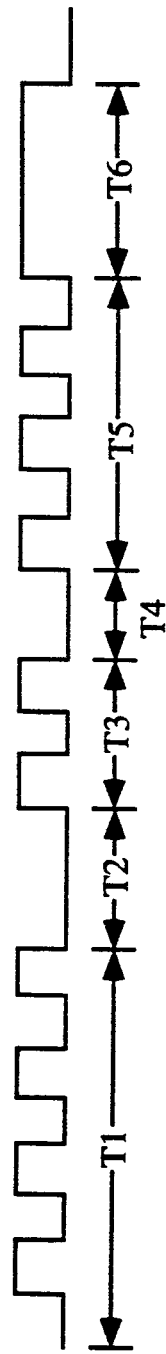
FIG. 4 shows a signal waveform made up of a clock signal and embedded data.
Figure 8:
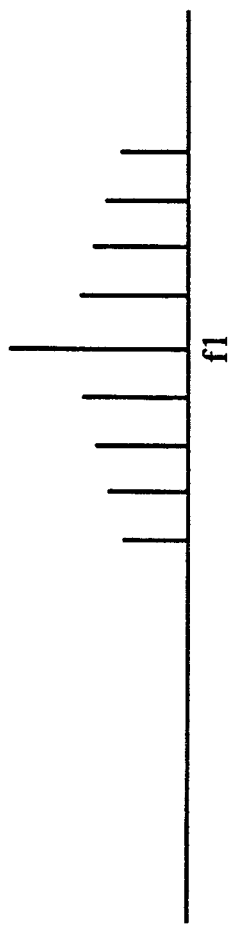
FIG. 8 shows a frequency spectrum that could correspond to a signal of the type shown in FIG. 4.

There are situations in which adding the summation circuit shown in FIG. 5 may still be insufficient to provide locking at the desired frequency. For example, consider the frequency spectrum shown in FIG. 8, which is a possible frequency spectrum for a waveform of the type shown in FIG. 4. This frequency spectrum not only has a high amplitude spike at the clock frequency $f_1$ (frequency of the signal shown in FIG. 4 for the time period T1), but a myriad of spikes at harmonics which are fractionally related to the clock frequency. (These are fractional harmonics, i e. they are related to the principal frequency $f_1$ by a rational fraction—i.e. a ratio of two integers). The fractional harmonics may be found very close to the principal frequency, hence there is a danger that the recovery phase-locked loop may lock one of the fractional harmonics, because of its ability to lock onto a weak signal out of noise. In order to further restrict the pull-in range of the recovery phase-locked loop 500b, a voltage clamp 510 is introduced, as shown in FIG. 5. By constraining the voltage difference between nodes 508a and 508b to a restricted range, this voltage clamp 510 will ensure the signal locked by the recovery phase-locked loop 500b will remain close to the center frequency set by the reference signal. The voltage clamp 510 also initializes the VCO 503b to operate at a point close to the center frequency within the pull-in range of the desired input frequency.

Figure 9:
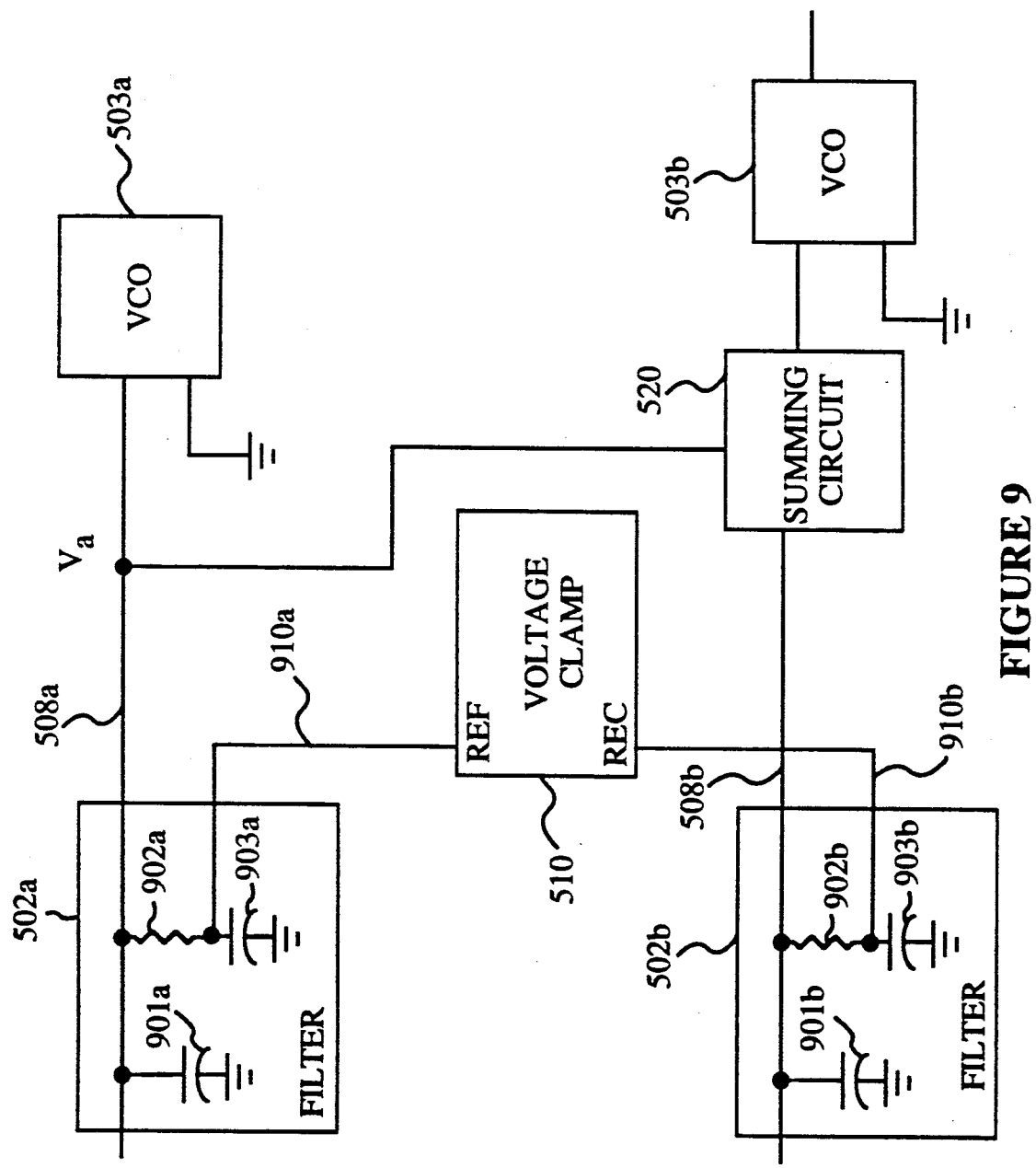
FIG. 9 shows an alternative implementation of a phase-locked loop in accordance with the present invention; in this FIG. only the filter stages 502a and 502b, and the voltage controlled oscillators 503a and 503b are shown.

It is, however, not required to provide the voltage clamp at the output nodes 508a and 508b of the filters 502a and 502b respectively. A different scheme achieving the voltage clamping effect on nodes 508a and 508b is shown in FIG. 9. In FIG. 9, filter 502a is shown to be implemented as a having two poles and one zero using two capacitors 901a and 903a, and resistor 902a. Filter 502b is shown to be identically constructed. Instead of applying the voltage clamp 510 to nodes 508a and 508b as shown in FIG. 5, the voltage clamp 510 is applied to nodes 910a and 910b inside the filters 502a and 502b between the junction of resistor 902a and capacitor 903a and between resistor 902b and capacitor 903b respectively. Under locking condition, no net current should flow through resistors 902a and 902b; therefore, nodes 508a and 910a have the same average voltage. Likewise, nodes 508b and 910b are at the same average voltage. Under locking condition, the voltage clamp 510 constrains nodes 508a and 508b as previously. However, by applying the voltage clamp at nodes 910a and 910b, the nodes 508a and 508b may each have a larger dynamic range, allowing the recovery phase-locked loop 500b to have better response to variations in the input signal $V_{in2}$.

Figure 6:
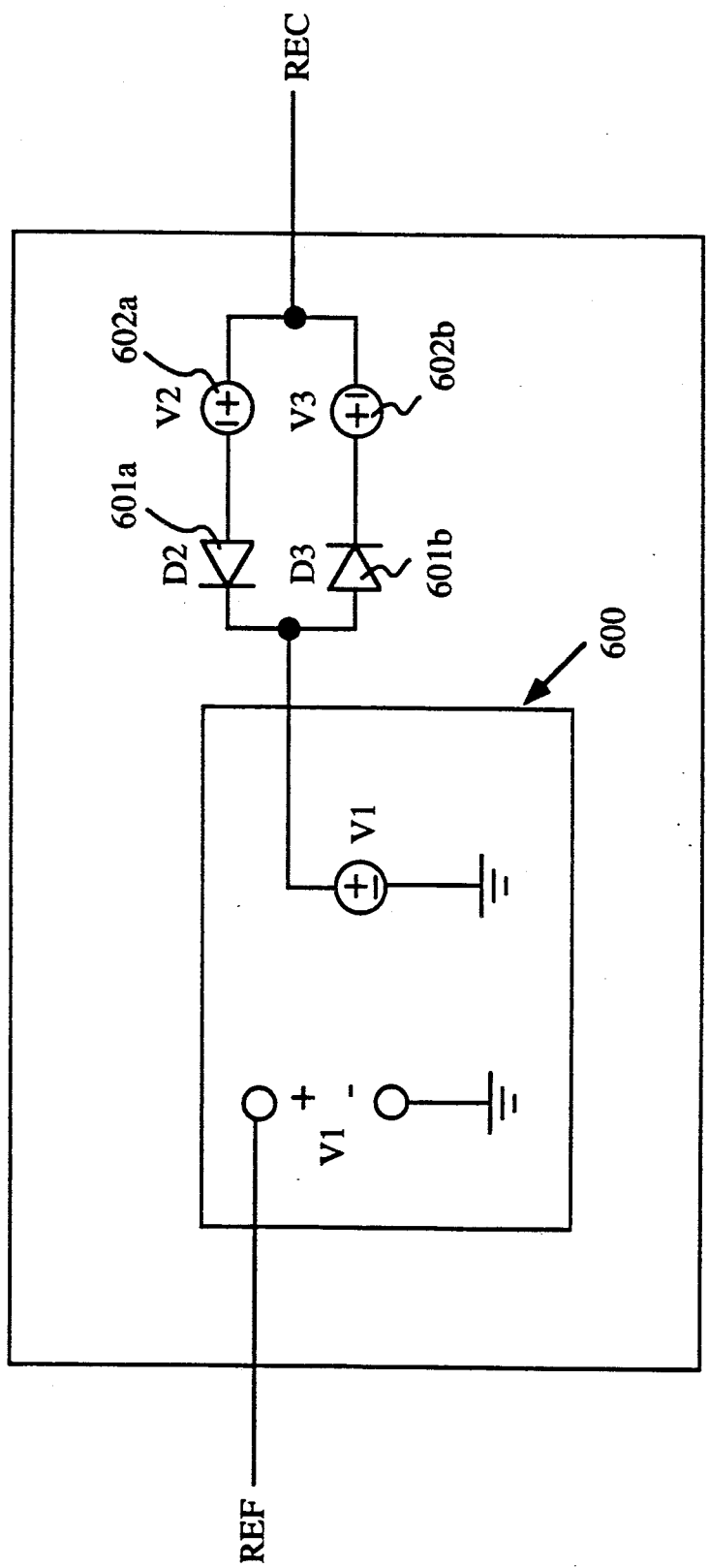
FIG. 6 shows a schematic voltage clamp circuit in accordance with the present invention.

Clamp 510 may be implemented in a variety of ways. One embodiment is shown schematically in FIG. 6. In FIG. 6, the circuit enclosed in the box 600 can be an amplifier or voltage follower with a unity gain. This amplifier or voltage follower 600 provides isolation between the input node REF and the output node REC of this voltage clamp. Diodes 601a and 601b, each biased respectively by voltage sources 602a and 602b, set the range of voltages in which signal $V_{REC}$ at node REC is allowed to deviate from signal $V_{REF}$ at node REF. It can be seen that, if voltage $V_{REF}$ at node REF is greater than the voltage $V_{REC}$ at node REC by greater than the bias voltage V2 and a forward-biased diode drop, diode 601a will turn on to constrain the voltage difference to V2 plus the forward-biased diode voltage drop. Conversely, if voltage $V_{REC}$ at node REC falls below $V_{REF}$ at node REF by greater than bias voltage V3 plus a forward-biased diode drop, diode 601b will turn on to constrain the voltage difference to V3 plus the forward-biased diode drop. Thus, the voltage swing allowed by clamp 510 (FIG. 5) can be mathematically expressed as:

$$V_{REF} + V2 + D2 > = V_{REC} > = V_{REF} - D3 - V3$$

where V2 and V3 are the values of voltage sources 602a and 602b respectively, and D2 and D3 are the forward-biased diode voltage drops across the diodes 601a and 601b respectively.

Hence, the phase-locked loop in accordance to the present invention is provided with (i) the ability to lock a signal from within a narrow pull-in range selected from a wide range of frequencies related to the pull-in range of the reference phase-locked loop 500a, (ii) the simple phase detector's ability for tracking signals in noise or the presence of other signals by the recovery phase-locked loop 500b, and (iii) the ability to avoid locking fractional harmonics using the voltage clamp 510.

Figure 7A:
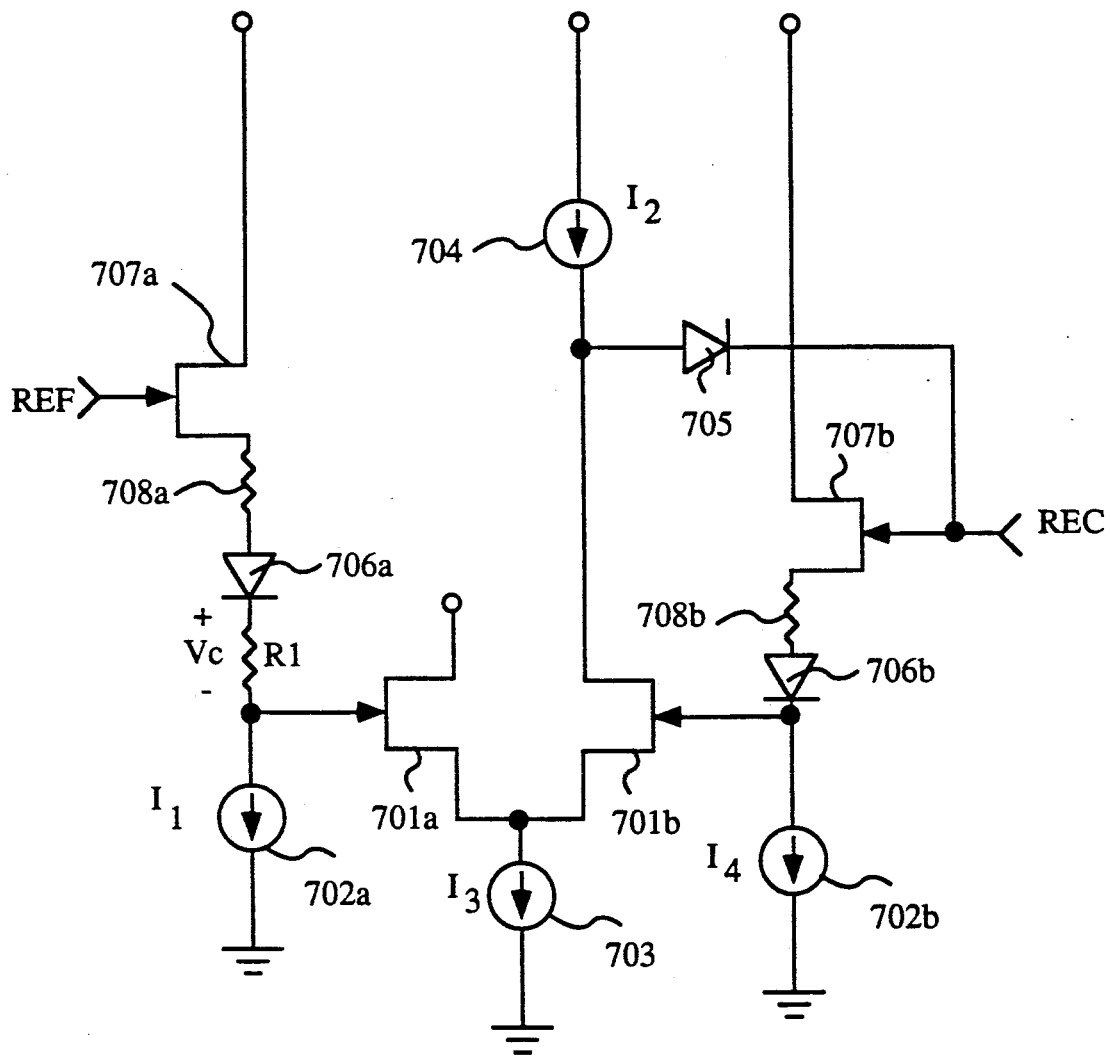
FIG. 7a shows one part of an embodiment of a voltage clamp circuit in accordance with the present invention; this part of the clamping circuit prevents the output node of the clamping circuit from falling below a predetermined voltage.
Figure 7B:
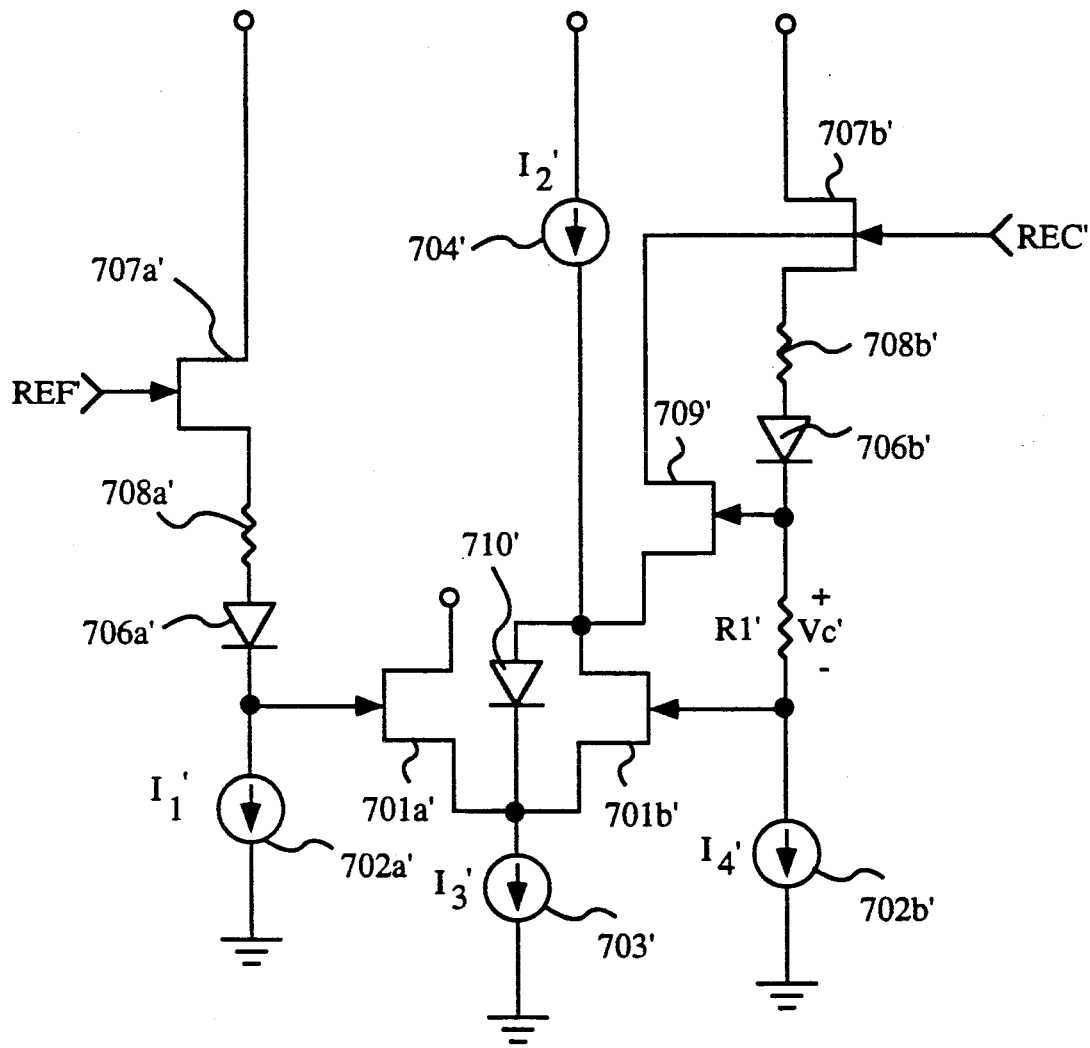
FIG. 7b shows another part of an embodiment of a voltage clamp circuit in accordance with the present invention; this part of the clamping circuit prevents the output node of the clamping circuit from rising above another predetermined voltage.

Another embodiment of the voltage clamp 510 is shown in two parts in FIGS. 7a and 7b. The circuit shown in FIG. 7a prevents the output node REC from falling below a predetermined voltage. The circuit shown in FIG. 7b prevents the output node REC from rising above another predetermined voltage.

In FIG. 7a, the transistors 701a and 701b form a well-matched differential pair. The load devices 702a, 702b, 703 and 704 act as constant current sources. Load devices 702a and 702b are designed to match each other as closely as possible. Load device 704 is designed such that, at the balance point of the differential pair 701a and 701b, load device 704 provides a smaller current than the current flowing through load device 703. This smaller current is preferably, but not necessarily, one half of the current in load device 703. In this example, to simplify the discussion below, the current in load device 704 is assumed to be substantially equal to one half of the current in load device 703. The resistor R1 provides a control voltage drop $V_c$ between the gate of transistor 701a and the cathode of diode 706a. This control voltage drop $V_c$ is determined by the current of current source 702a, since all current through current source 702a must flow through resistor R1, the gate of transistor 701a being of high impedance. Transistor 701a is biased such that it has a reasonable drain-to-source voltage and operating in the saturation region of the transistor. Transistors 707a, 707b, 701a and 701b have their drains connected to a positive power supply.

Diodes 706a and 706b are designed to be as closely matched as possible. Likewise, transistors 707a and 707b, and resistors 708a and 708b, are also designed to be as closely matched as possible.

The structure formed by transistor 707a, resistor 708a and diode 706a, together with the corresponding structure formed by transistor 707b, resistor 708b and diode 706b are not necessary for the practice of the present invention; the matched transistor, resistor and diode pairs may each be eliminated independent of the other matched pairs. Transistors 707a and 706b obviate the need for node REF and REC respectively to provide the current in current sources 702a and 702b, hence transistors 707a and 707b may be eliminated if the nodes REF and REC can provide the necessary currents for current sources 702a and 702b. In that case, the nodes REF and REC will be connected to the anodes of diodes 706a and 706b respectively. The presence of diodes 706a and 706b enhances the common mode range of the circuit, and allows voltages at nodes REC and REF to go higher than if the diodes 706a and 706b are not present. Diodes 706a and 706b also help to ensure that transistors 701a and 701b operate in their respective saturation regions, by ensuring that the drain voltages at transistors 701a and 701b are substantially above their gate voltages. These diodes are not necessary if the transistors 701a and 701b are true enhancement devices, where drain and gate voltages may be substantially the same even operating at the region of saturation. However, in many processes, the threshold voltage targets of the enhancement mode devices are very close to zero volts, such that over variation of process and/or temperature, the threshold voltage may actually be negative.

Resistors 708a and 708b perform a function similar to the function of diodes 706a and 706b (i.e. level shifting). Resistors are more versatile than diodes in that the voltage drops attainable across resistors may each be much smaller than the forward-biased voltage of a diode. If a larger voltage drop is desired, the resistors 708a and 708b may be replaced by one or more diodes.

It should also be evident that the level shifting function of the diodes 706a and 706b, resistors 708a and 708b may be provided alternatively by other combinations of resistors and diodes. The function of transistors 707a and 707b, likewise, may be provided by any transistors including MOSFETs, JFETs, and bipolar transistors.

When the differential pair 701a and 701b is not balanced, e.g. when voltage $V_{REC}$ at the output node REC is falling, so that the gate of transistor 701b is slightly below the corresponding gate voltage at transistor 701a, slightly less than half of the current in current source 703 will be provided by the current through transistor 701b. As a result, the voltage at the drain of transistor 701b will begin to rise, pulled by current source 704 towards the power supply voltage, until the point when the diode 705 is forward-biased to cause a current to flow from current source 704, through diode 705 and out of the output node REC to oppose any further drop of the voltage $V_{REC}$ at node REC.

At the point when the differential pair 701a and 701b are balanced, the voltage at gate 701a is the voltage $V_{REF}$ less the gate-to-source voltage of transistor 707a, the diode drop of diode 706a and the voltage drop $V_c$ at resistor R1. Since the transistors 707a and 707b, and the diodes 706a and 706b are designed to be as closely matched as possible, at this balance point of differential pair 701a and 701b, the voltage difference between the voltage $V_{REF}$ at the input node REF, and the voltage $V_{REC}$ at the output node REC must be equal to the control voltage drop $V_c$. If the voltage $V_{REC}$ at the output node REC falls below voltage $(V_{REF} - V_c)$, the mechanism discussed above whereby current will flow out of node REC to oppose further drop of $V_{REC}$ will initiate.

On the other hand, if the voltage at REC rises, such that the gate voltage at transistor 701b is slightly above the gate voltage at corresponding transistor 701a, then more than half of the current at current source 703 will have to be provided through transistor 701b. As a result, the voltage at the drain terminal of transistor 701b falls, resulting in the diode 705 being reversed biased. The source voltage at the source terminal of transistor 701b will continue to fall. Hence, it is seen that the circuit in FIG. 7a prevents the voltage $V_{REC}$ at output node REC from falling below the predetermined voltage $(V_{REF} - V_c)$, provided, of course, that the current flowing out of node REC is sufficient to overwhelm the external circuit trying to pull the node REC lower.

FIG. 7b shows a circuit in accordance with the present invention which prevents the voltage $V_{REC}$ at node REC to rise above a predetermined voltage.

The circuit shown in FIG. 7b is similar to the circuit shown in FIG. 7a. In fact, the elements of this circuit shown in FIG. 7b having counterparts performing similar function in FIG. 7a are given the same reference numerals, each distinguished from its counterpart in FIG. 7a by a "'" appended to its reference numeral. Hence, in FIG. 7b, the differential pair are numbered 701a' and 701b', the transistors 707a' and 707b' are similar in function to their counterparts 707a and 707b in FIG. 7a etc. One difference between the circuits in FIGS. 7a and 7b is the resistor R1', which is now on the output node REC side of the circuit, as distinguished from resistor R1 in FIG. 7a, which is shown on the REF side of the circuit. It is therefore apparent that, in order to achieve balanced condition in the circuit, i.e. equal voltages at the gates of transistors 701a' and 701b', the voltage $V_{REC}$ at node REC must be higher than the voltage $V_{REF}$ at node REF by the control voltage $V_{c'}$. This voltage $V_{c'}$ need not be equal in magnitude to the voltage $V_c$ shown in FIG. 7a. In fact, the choice of $V_c$ and $V_{c'}$ must be determined by the environment in which the circuit is to operate.

The diode 705 in FIG. 7a does not have a counterpart in FIG. 7b. Instead, transistor 709' and diode 710' are provided in its place in FIG. 7b; transistor 709' and diode 710' have no counterparts in FIG. 7a. Diode 710' is not necessary for the practice of the present invention. The benefit of providing diode 710' will be discussed at a later section. If the voltage at node REC rises above the balance point of the differential pair 701a' and 701b', then more than half of the current flowing through current source 703' will flow through transistor 701b'. As a result, the voltage at the drain of transistor 701b, will drop below the gate voltage of transistor 709' by greater than the threshold voltage of transistor 709', thereby turning on transistor 709'. The current through transistor 709' will be drawn from node REC', tending to counteract the rising voltage $V_{REC}$ at node REC'.

On the other hand, if the voltage $V_{REC}$ at REC' falls, such that the voltage at the gate of transistor 701b' falls below the gate voltage at transistor 701a', then less than half the current in current source 703' will flow through transistor 701b', tending to pull the drain voltage of transistor 701b' towards power supply level. At some point, the difference between the voltage at the drain of 701b' and the gate voltage of transistor 709' will be less than the threshold voltage of transistor 709', thereby turning transistor 709' off, as the voltage $V_{REC}$ at node REC' continues to fall. It can be seen that the voltage drop across the drain and source terminals of transistor 701b' is substantially $V_{c'}$ because the drain voltage of transistor 701b' is a threshold voltage below the gate voltage of transistor 709', the source voltage of transistor 701b is again a threshold voltage below the gate voltage of transistor 701b', and the voltage drop between the gates of transistors 701b' and 709' is $V_{c'}$.

Therefore, the circuit shown in FIG. 7b prevents the voltage $V_{REC}$ at node REC' to rise above the voltage $(V_{REF}+V_{c'})$.

Figure 7C:
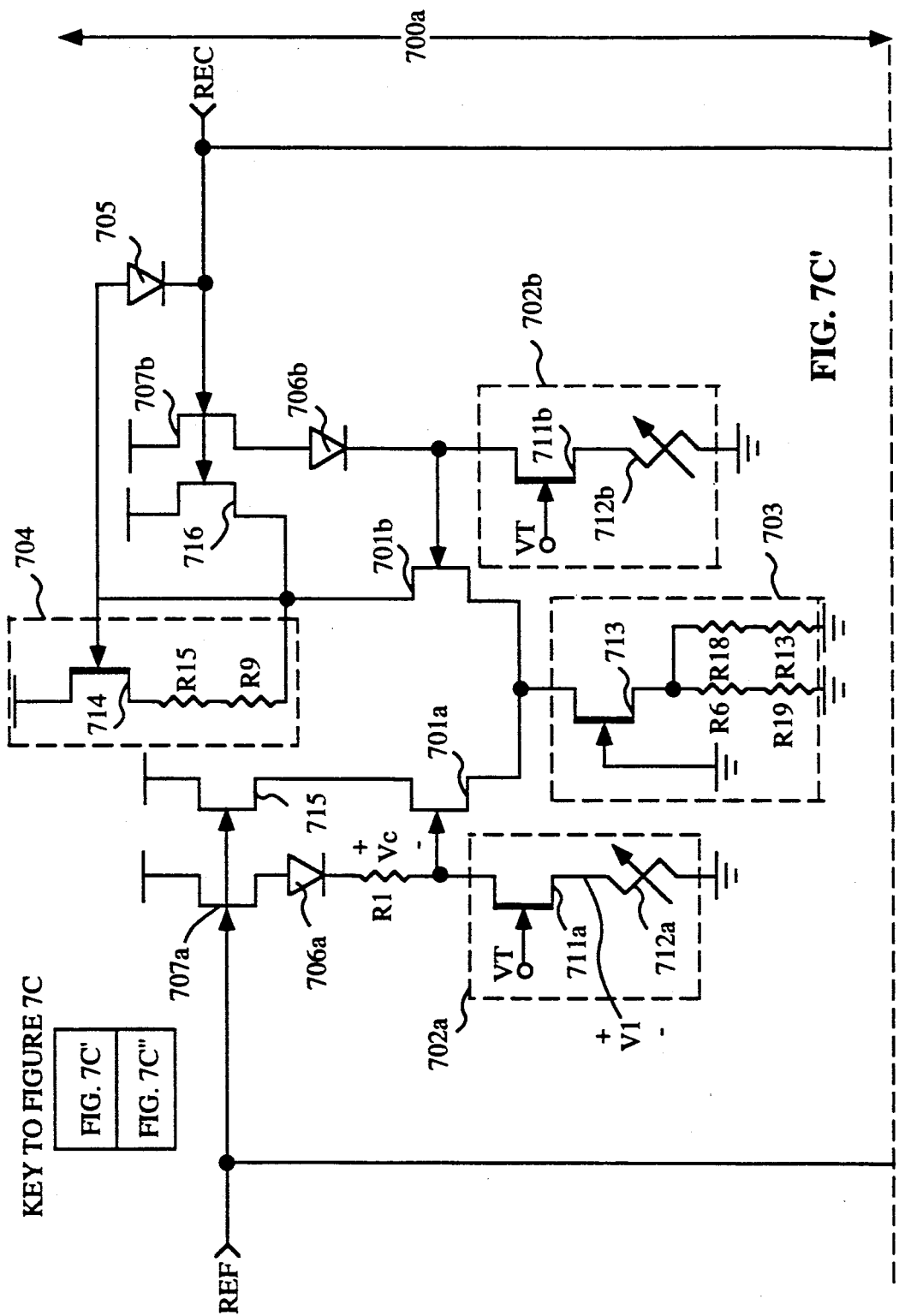
FIGS. 7c' and 7c'', which together form
Figure 7D:
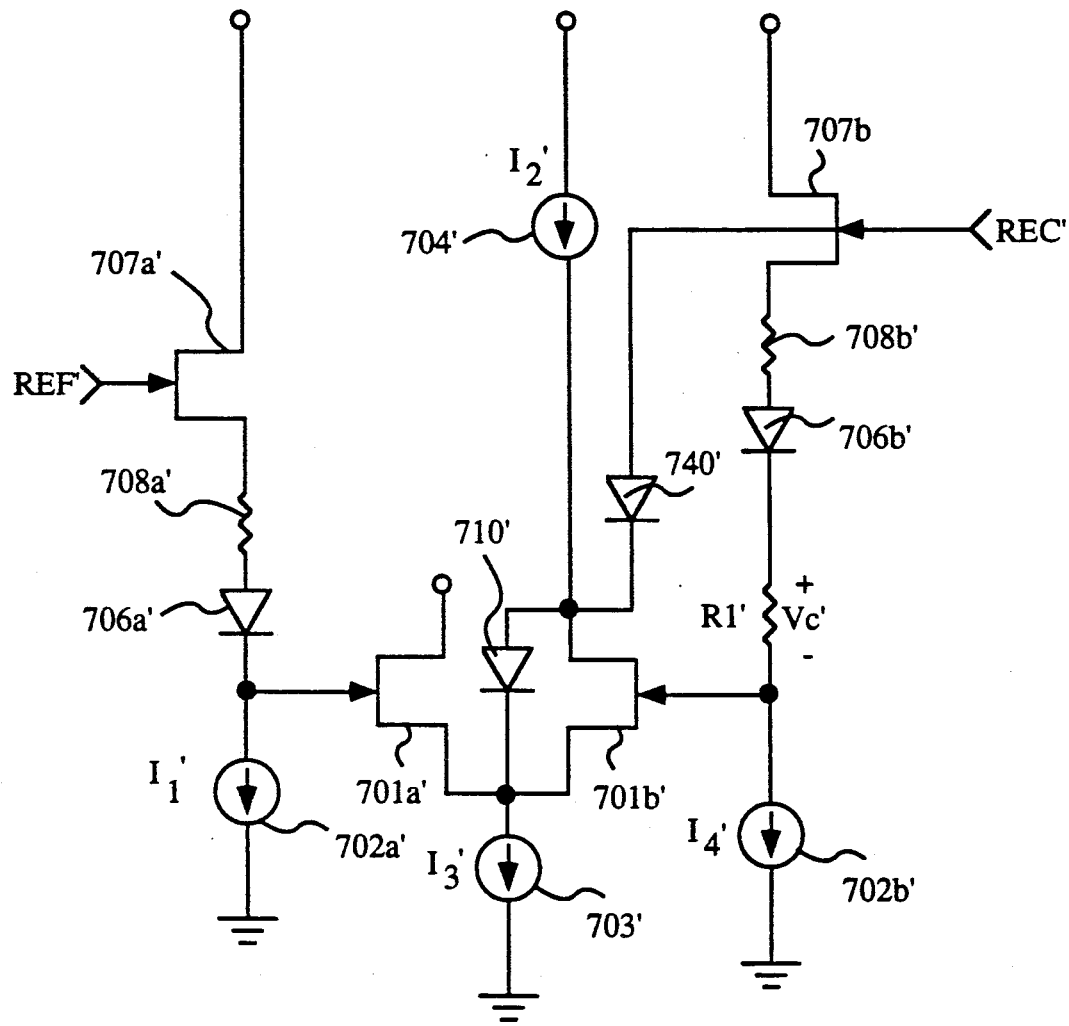
FIG. 7d shows an alternative implementation of a part of a voltage clamp circuit in accordance with the present invention; this part of the clamping circuit prevents the output node of the clamping circuit from rising above a predetermined voltage.

FIG. 7d shows another implementation of a circuit to prevent the voltage $V_{REC}$ at node REC' from rising above a predetermined voltage, in accordance with the present invention In FIG. 7d, in contrast with FIG. 7b, the transistor 709' is replaced by diode 740'. As the voltage $V_{REC}$ at node REC' rises above the balance point $(V_{REF}+V_{c'})$, more than half of the current through current source 703' flows through transistor 701b'. As a result, the voltage at the drain of the transistor 701b' drops below the voltage $V_{REC}$ by greater than the forward biased diode drop of diode 740'. At that point, current will be drawn by diode 740' (now forward biased) from node REC' to counteract the rising voltage $V_{REC}$. It can be similarly seen that a falling voltage $V_{REC}$ at node REC' will cause the node at the drain of transistor 701b' to rise, thereby reverse biasing diode 740'.

It is now evident that by providing the circuits shown in FIGS. 7a and 7b or alternatively, the circuits in FIGS. 7a and 7d, in parallel, i.e. by connecting node REC to node REC' and node REF to node REF', the voltage $V_{REC}$ at node REC may be clamped between $(V_{REF}-V_c)$ and $(V_{REF}+V_{c'})$, suitable for use as the voltage clamp 510 shown in FIG. 5.

Figure 10:
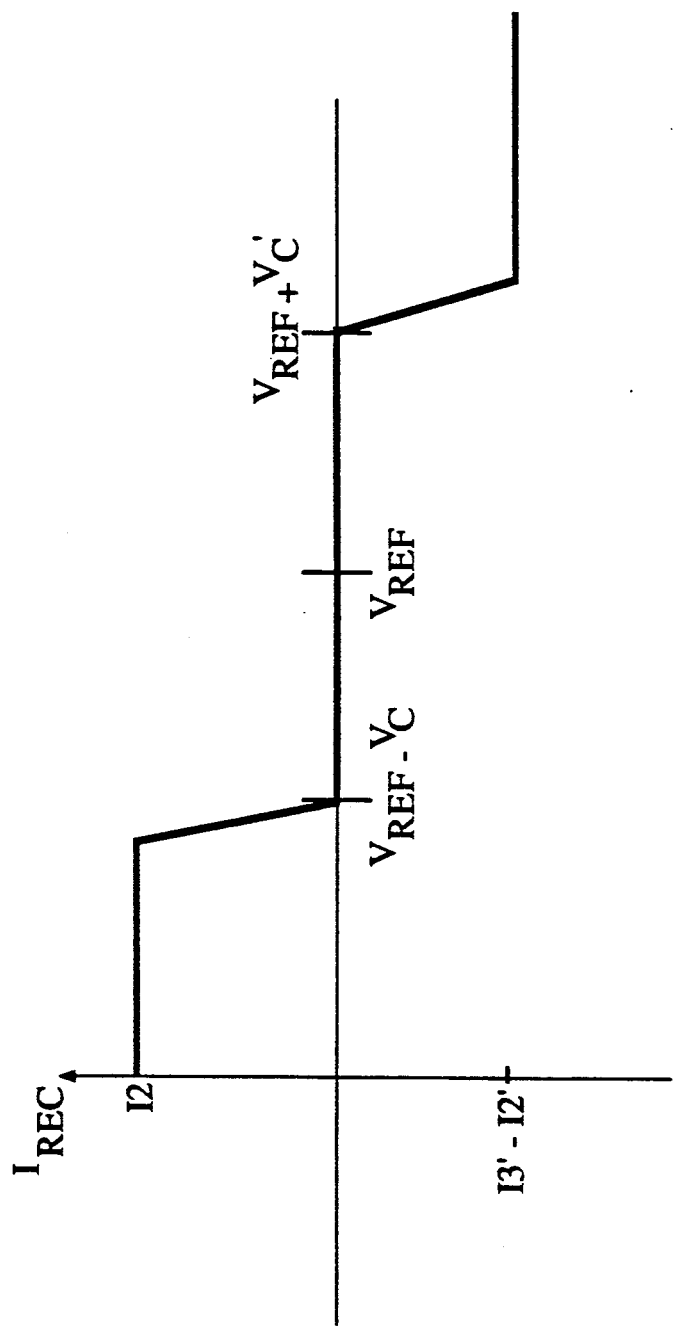
FIG. 10 shows the current $I_{REC}$ at node REC as a function of the voltage $V_{REC}$ at node REC due to the application of a voltage clamp in accordance with the present invention.

A summary of current $I_{REC}$ flowing into node REC as a result of voltage swing at node REC is shown in FIG. 10.

Another embodiment of the present invention is shown in FIG. 7c, which is shown in two parts as FIGS. 7c' and 7c''. In FIG. 7c, the circuit 700a for preventing voltage $V_{REC}$ at node REC to rise above a predetermined voltage is shown in the upper portion (i.e. FIG. 7c') of FIG. 7c, and the circuit 700b for preventing voltage $V_{REC}$ from falling below another predetermined voltage is shown in the lower portion (i.e. FIG. 7c'') of FIG. 7c. Some elements of the circuit in FIG. 7c, such as the differential pair 701a and 701b, and the resistors R1 and R1' providing the control voltage drops, performs the same function as corresponding elements in the circuits provided in FIGS. 7a and 7b. These circuit elements are given the same reference numerals in FIG. 7c to highlight the equivalence with their counterparts in FIGS. 7a and 7b. These elements are transistors 701a, 701b, 701a', 701b', 707a, 707b, 707a', 707b' and 709'; diodes 706a, 706b, 706a', 706b', 705 and 710'; and resistors R1, R1', 708a' and 708b'. The functions of the above listed circuit elements are discussed in detail above, and will not be repeated here.

On the left hand side of FIG. 7c (FIG. 7c'') is shown a circuit comprising transistors 720, 721, and 723, diode 722 and a number of resistors. This circuit is used to provide a constant voltage, labelled VT, used in various places of the circuit shown in the FIG. 7c to provide constant current sources. The structure consisting of transistor 723 and resistors R4 and R5 is essentially a constant current source The gate terminal of transistor 723 and one side of R4 is tied to a voltage source $V_{EE}$ which has a voltage below common ground. The current flowing through the series resistors R4 and R5 is determined by the sum of their resistance values, and the voltage drop across the gate and source of transistor 723. Note that transistor 723 is a depletion mode device, so that the gate-to-source voltage drop is negative. There is an analogous structure consisting of transistor 720 and resistor R3. The current flowing through the resistor R3 is similarly determined by its resistance value and the gate-to-source drop in transistor 720, which is also a depletion mode device.

In this embodiment, the size of transistor 720 is deliberately chosen to be five times the size of transistor 723. Similarly, the resistance of R3 is also deliberately chosen to be five times smaller than the total resistance of resistors R4 and R5 connected in series. Since the voltage drop across R3 and the voltage drop across the series resistors R4 and R5 are the same, being the gate-to-source voltage of transistor 720 and 723 respectively, the current flowing through resistor R3 will be five times the current flowing through the series transistors R4 and R5. This ratio may be changed by using different values of resistors R3, R4, and R5, or different "pinch-off" voltages of transistors 720 and 723, or different sizes of transistors 720 and 723.

It is evident from FIG. 7c (FIG. 7c'') that the current through transistor 720 and resistor R3 must be sunk to common ground or voltage source $V_{EE}$ through either transistor 721 or the structure of transistor 722 and resistors R4 and R5. Therefore, the size of transistor 721 may be chosen such that at the point where transistor 721 is conducting at a low current density (i.e. the voltage drop across the gate and source terminals of transistor 721 is not significantly above transistor 721's threshold voltage), one-fifth of the current through transistor 720 is sunk via transistor 723, and the rest (i.e. four-fifths) of the current through transistor 720 is sunk through transistor 721. Transistor 721 is shown to be an enhancement mode transistor, although a depletion mode transistor may also be used. The voltage source $V_{EE}$ is necessary to provide for a diode drop across the drain and gate of transistor 721, and to allow a negative gate-to-source voltage drop in transistor 721. Transistor 721 may have a very small threshold voltage above ground, or in fact a slight negative threshold voltage even, due to variations in process and temperature in some instances, and particularly if transistor 721 is a depletion mode transistor.

Notice that if the value of VT at the gate of transistor 721 is higher than the voltage required to cause four-fifths of the current through transistor 720 to be sunk through transistor 721, the drain voltage of transistor 721 will begin to fall because of the larger current now flowing through transistor 721. However, the voltage at the gate terminal of transistor 721, which is one forward-biased diode drop below the drain voltage of transistor 721, will also fall accordingly. The falling voltage at the gate terminal of transistor 721 will in turn act to restrict the current flowing through transistor 721, until the current through transistor 721 is once again about four-fifths of the current through transistor 720.

Conversely, if the voltage VT at the gate of transistor 721 is lower than is required to sink four-fifths of the current through transistor 720, the drain voltage at transistor 721 will rise towards the supply voltage at point A. The voltage VT at the gate terminal of transistor 721 will correspondingly rise, due to the action of diode 722. The rise of voltage VT at the gate of transistor 721 tends to increase the current flowing through transistor 721, thereby providing a pull on the drain voltage of transistor 721 in the opposite direction, until the balance point is reached, whereby transistor 721 sinks four-fifths of the current through transistor 720. Therefore, it can be seen that the structure of transistors 720, 721 and 723 provides a circuit with negative feedback tending to drive the voltage VT towards a balance point, and hence serves well as a constant voltage source, over a range of conditions of process and temperature. The voltage VT is biased at a 721. Capacitor C1 is provided at the gate terminal of transistor 721 to provide noise immunity, further stabilizing the output voltage VT.

This constant voltage source VT is provided to the gate of depletion mode transistor 711a, which is connected in series with resistor 712a. The combination of transistor 711a and resistor 712a is intended to perform the function of current source 702a shown in FIG. 7a. Therefore, a box is drawn around transistor 711a and resistor 712a to highlight the correspondence. Since the threshold voltage of a depletion mode transistor is negative, called the "pinch-off" voltage, the drop across resistor 712a is the sum of VT and the magnitude of the pinch-off voltage. In many processes the sum of the threshold voltage of an enhancement mode transistor and the magnitude of the pinch-off voltage of a depletion mode transistor is fairly constant over process variation and temperature, from wafer to wafer, and from die to die. As a result, the current through resistor 712a will be fairly constant, providing an accurate and inexpensive constant current source. The same type of current sources are provided to structures formed by transistors 711b and resistor 712b, transistor 711a' and resistor 712a', and transistor 711b' and resistor 712b'. These structures are also respectively labelled 702b, 702a' and 702b' to highlight their correspondence to the identically numbered structures in FIGS. 7a and 7b.

Resistors, 712a, 712b, 712a' and 712b' can be made adjustable, as shown in FIG. 7c, to provide adjustability to the control voltages $V_c$ and $V_{c'}$. A technique, for example, involving laser programmable fuses may be used to adjust the resistance in resistors 712a, 712b, 712a' and 712b' to achieve the control voltages $V_c$ and $V_{c'}$ desired.

The structure formed by depletion mode transistor 713 and resistors R6, R13, R18 and R19 forms another constant current source 703 (FIG. 7c'), so numbered to highlight its correspondence to current source 703 shown in FIG. 7a. A similar structure formed by transistor 713' and resistors R8, R10, R11 and R12 forms another constant current source 703' in the lower circuit (i.e. FIG. 7c'') in FIG. 7c. The current in constant current source 703 is determined by the equivalent resistance value of these resistors R6, R13, R18, and R19 and the threshold voltage (pinch-off voltage) of transistor 713.

Another constant current source 704 (FIG. 7c') is provided by the transistor 714 and resistors R15 and R9. This current source 704 is so numbered to highlight the correspondence to current source 704 shown in FIG. 7a. The current flowing through transistor 714 is determined by the total resistance value of resistors R15 and R9 connected in series, the threshold (or pinch-off) voltage of transistor 714, and the size of transistor 714. This current through transistor 714 is designed to be half the value of the current through transistor 713 in the constant current source 703. The function of this current value is discussed above in conjunction with the differential pair 701a and 701b, and is not repeated here. An analogous current source 704' is provided in the lower circuit shown in FIG. 7c, designed to provide half the current sunk in current source 703'.

One difference between the upper circuit 700a (FIG. 7c') shown in FIG. 7c and the circuit shown in FIG. 7a is the transistor 715. Transistor 715 is connected at its drain terminal to a positive power supply and connected at its source terminal in series with the drain terminal of transistor 701a. As is seen in FIG. 7a, transistor 701a can be connected directly to the positive power supply. However, the addition of transistor 715 is preferable, in that transistor 715 allows transistor 701a to have a constant drain-to-source voltage over variations in $V_{REF}$ at node REF As can be seen from FIG. 7c, the source voltage of transistor 701a is $V_{REF}$ minus the sum of the gate-to-source voltage drop of transistor 707a, the voltage drop across diode 706a, the voltage drop across resistor R1 and the gate-to-source voltage drop of transistor 701a. At the same time, the drain voltage of transistor 701a is $V_{REF}$ minus the gate-to-source voltage drop of transistor 715. Hence, as $V_{REF}$ fluctuates, the drain-to-source voltage in transistor 701a remains constant. A similar effect across transistor 701a' is achieved by transistor 715' in the lower circuit 700b (FIG. 7c'') of FIG. 7c.

Another difference between the upper circuit 700a (FIG. 7c') shown in FIG. 7c and the circuit shown in FIG. 7b is transistor 716 in FIG. 7c. If the voltage at the gate terminal of transistor 701b is higher than the voltage at the gate terminal of transistor 701a, the current through 701b will be greater than half the current sunk in current source 703, and is capable of "overwhelming" current source 704. As a result, the drain voltage of transistor 701b may drop so much that the transistor 701b goes into the linear region of operation. To prevent transistor 701b from going into the linear region, transistor 716 is provided. Transistor 716 will clamp the voltage at the drain terminal of transistor 701b to $V_{REC}$ minus the gate-to-source voltage drop of transistor 716, thereby preventing transistor 701b from going into the linear region of transistor operation.

One difference between the lower circuit 700b (FIG. 7c'') shown in FIG. 7c and the circuit shown in FIG. 7b is the presence of diode 710'. As discussed previously, as the voltage $V_{REC}$ at node REC falls, such that the voltage at the gate terminal of transistor 701b' falls below the voltage at the gate terminal of transistor 701a', less than one half of the current in current source 703' will be supplied by transistor 701b', causing the voltage at the drain terminal of transistor 701b' to rise. However, the drain voltage of transistor 701b' will only rise until the drain-to-source voltage of transistor 701b' is substantially equal to the forward-biased diode voltage drop of diode 710', which prevents the drain voltage of transistor 701b' from rising further by turning on and diverting the current of current source 704' to current source 703', thereby bypassing transistor 701b'. Diode 710' therefore provides a constant drain-to-source voltage over variations of $V_{REC}$ at node REC for transistor 701b', similar in function to that of transistor 716 for transistor 701b. The forward-biased voltage drop at diode 710' is designed to be a few hundred millivolts higher than $V_{c'}$, sufficient to allow the transistor 709' to turn off when the drain voltage of transistor 701b' rises, but constraining the voltage drop across the source and drain of transistor 701b' to be no more than the forward-biased voltage of diode 710'. Obviously, more diodes or other clamping means could be used to constrain the voltage swing at the drain terminal of transistor 701b', if one forward-biased diode voltage drop is not enough for the value of $V_{c'}$ chosen.

Note that the embodiments of the present invention described herein are constructed with components commonly and currently available in Gallium Arsenide (GaAs) or similar compound semiconductor technology. For example, note that, in the embodiments described herein, the present invention does not depend on the use of insulated gate device or other structures not readily available in GaAs technology. In addition, note that, in this application, the MESFETs are biased such that the gate-to-source diode is generally forward-biased (i.e., conducting current).

The above detailed description and embodiments in accordance to the present invention are meant to be exemplary and not limiting. The skilled person in the art will be able to provide numerous modifications and variations within the scope of the present invention, after consideration of the above detailed description in conjunction with the accompanying drawings.

We claim:

1. A circuit receiving an input signal and generating an output signal, comprising:
    first and second voltage controlled oscillators, said first voltage controlled oscillator providing a control signal, said second voltage controlled oscillator operatively coupled to said input signal and providing said output signal; and
    constraining means receiving said control signal for limiting the voltage swing at an input terminal of said second voltage controlled oscillator to thereby constrain the frequency range of operation of said second voltage controlled oscillator in accordance with said control signal, wherein said constraining means comprises a clamping circuit.

2. A circuit as in claim 1, wherein said first voltage controlled oscillator receives a reference signal, said reference signal determining a value of said control signal.

3. A circuit receiving an input signal and generating an output signal, comprising:
    first and second phase-locked loops said first phase-locked loop providing a control signal, said second phase-locked loop receiving said input signal and providing said output signal; and
    constraining means receiving said control signal for limiting the voltage swing at an input terminal of said second phase-locked loop to thereby constrain the frequency range of operation of said second phase-locked loop in accordance with said control signal, wherein said constraining means comprises a clamping circuit.

4. A circuit as in claim 3, wherein said first phase-locked loop receives a reference signal, said reference signal determining a value of said control signal.

5. An apparatus receiving first and second input signals, said apparatus comprising:
    (a) a first phase-locked loop receiving said first input signal and providing a center frequency based on said first input signal comprising:
        (i) first voltage-controlled oscillator for receiving a phase and frequency correction signal, and for providing a first feedback signal responsive to said phase and frequency correction signal; and
        (ii) phase frequency detector and filter means for detecting a phase and frequency difference between said first input signal and said first feedback signal, and for providing said phase and frequency correction signal responsive to said phase and frequency difference;
    (b) a second phase-locked loop receiving said second input signal comprising:
        (i) second voltage-controlled oscillator, substantially the same as said first voltage-controlled oscillator, for receiving a correction signal, and for providing a second feedback signal responsive to said correction signal; and
        (ii) phase detector and filter means for detecting a phase difference between said second input signal and said second feedback signal, and for providing a phase correction signal responsive to said phase difference;
    (c) constraining means constraining the frequency range of said second phase-locked loop such that said second phase-locked loop locks on said second input signal if said second input signal is within a pull-in range centered around said center frequency, comprising:
        (i) summation means for receiving said phase and frequency correction signal and said phase correction signal and for providing a summed signal to said second voltage controlled oscillator; and
        (ii) a voltage clamp connecting said phase and frequency detector and filter means, such that the difference between said phase and frequency correction signal and said phase correction signal is constrained to within a predetermined voltage interval.

6. An apparatus as in claim 5, wherein said phase frequency detector and filter means comprises:
    a phase frequency detector responsive to both phase difference and frequency difference between said first input signal and said first feedback signal, said phase frequency detector providing a phase and frequency difference signal; and
    a first filter means for receiving said phase and frequency difference signal and providing said phase and frequency correction signal.

7. An apparatus as in claim 6, wherein said phase detector and filter means comprises:
    a phase detector means responsive to phase difference between said second input signal and said second feedback signal, said phase detector providing a phase difference signal; and
    a second filter means for receiving said phase difference signal and providing said phase correction signal.

8. An apparatus as in claim 7, wherein said first filter and second filter means each comprises:
    a first capacitor having first and second terminals;

a resistor having first and second terminals, said first terminal of said resistor connected to said second terminal of said first capacitor forming a common terminal; and a second capacitor also having first and second terminals, said first terminal of said second capacitor connected to said first terminal of said first capacitor, and said second terminal of said second capacitor connected to said second terminal of said resistor.

9. An apparatus as in claim 8, wherein said voltage clamp connects said common terminal of said first filter means and said common terminal of said second filter means.

10. An apparatus as in claim 5, wherein said summation means comprises:
a first resistor having first and second terminals, said first terminal receiving said phase and frequency correction signal; and
a second resistor also having first and second terminals, said first terminal of said second resistor receiving said phase correction signal, said second terminal of said second resistor connected to said second terminal of said first resistor, and said second terminal of said second resistor providing said correction signal of said second voltage-controlled oscillator.

11. An apparatus as in claim 5, wherein said voltage clamp comprises:
a reference terminal;
a clamped terminal;
first voltage limiting means for preventing voltage at said clamped terminal to be smaller than voltage at said reference terminal by more than a first predetermined voltage; and
second voltage limiting means for preventing said voltage at said clamped terminal to be greater than voltage at said reference terminal by more than a second predetermined voltage.

12. An apparatus as in claim 11, wherein said first voltage limiting means comprises:
a reference transistor having control, first and second terminals;
a clamp transistor, also having control, first and second terminals, said second terminal of said clamp transistor connected to said second terminal of said reference transistor to form a differential pair, and said control terminal of said clamp transistor receiving a signal responsive to the voltage at said clamped terminal;
preset voltage means having first and second terminals for providing said first predetermined voltage across its first and second terminals, said first terminal of said preset voltage means connected to said reference terminal and said second terminal of said preset voltage means connected to said control terminal of said reference transistor; and
current drive means for driving current into said clamped terminal when the voltage at said control terminal of said reference transistor is greater than the voltage at said control terminal of said clamped transistor;

13. An apparatus as in claim 12, further comprising:

a first current source connected to said second terminal of said clamp transistor for providing a first substantially constant current; and
second current source connected to said first terminal of said clamp transistor for providing a second substantially constant current, said second substantially constant current being less than said first substantially constant current.

14. An apparatus as in claim 13, wherein said first current source comprises a depletion mode transistor and a resistive element.

15. An apparatus as in claim 13, wherein said second current source comprises a depletion mode transistor and a resistive element.

16. An apparatus as in claim 12, wherein said preset voltage means comprises a resistor.

17. An apparatus as in claim 12, wherein said current drive means comprises a diode.

18. An apparatus as in claim 11, wherein said second voltage limiting means comprises:
a reference transistor having control, first and second terminals, said control terminal of said reference transistor receives a signal responsive to the voltage at said reference terminal;
a clamp transistor, also having control, first and second terminals, said second terminal of said clamp transistor connected to said second terminal of said reference transistor to form a differential pair;
preset voltage means having first and second terminals for providing said first predetermined voltage across its first and second terminals, said first terminal of said preset voltage means connected to said clamped terminal and said second terminal of said preset voltage means connected to said control terminal of said clamp transistor; and
current drive means for sinking current from said clamped terminal when the voltage at said control terminal of said reference transistor is smaller than the voltage at said control terminal of said clamped transistor.

19. An apparatus as in claim 18, further comprising:
first current source connected to said second terminal of said clamp transistor for providing a first substantially constant current; and
second current source connected to said first terminal of said clamp transistor for providing a second substantially constant current, said second substantially constant current being less than one half of said first substantially constant current.

20. An apparatus as in claim 19, wherein said first current source comprises a depletion mode transistor and a resistive element.

21. An apparatus as in claim 19, wherein said second current source comprises a depletion mode transistor and a resistive element.

22. An apparatus as in claim 18, wherein said preset voltage means comprises a resistor.

23. An apparatus as in claim 18, wherein said current drive means comprises a transistor.

24. An apparatus as in claim 18, further comprising a clamping diode having a cathode and an anode, said anode of said clamping diode connected to said first terminal of said clamp transistor, and said cathode of said clamping diode connected to said second terminal of said clamp transistor.

25. An apparatus as in claim 18, wherein said current drive means comprises a diode.

* * * * *

UNITED STATES PATENT AND TRADEMARK OFFICE
CERTIFICATE OF CORRECTION

PATENT NO.  : 5,072,195
DATED       : December 10, 1991
INVENTOR(S) : Andrew C. Graham, et al.

It is certified that error appears in the above-identified patent and that said Letters Patent is hereby corrected as shown below:

Abstract - line 2, after "incoming" insert --signal--.

Abstract - line 4, delete "requencies" and insert --frenquencies--.

Col. 1, line 12, insert --now U.S. Patent 5,063,343 issued Nov. 5, 1991--.

Col. 1, line 19, insert --now abandoned--.

Col. 1, line 23, insert --now U.S. Patent 5,127,026 issued June 30, 1992--.

Col. 1, line 26, delete "07,505,306" and insert --07/505,376, now abandoned--.

Col. 2, line 60, delete "1a'" and insert --2a'--.

Col. 13, line 18, delete "$V_{REC}$" and insert --$V_{REC}^1$--.

Col. 13, line 19, delete "$V_{REF}$" and insert --$V_{REF}^1$ --.

Col. 13, line 21, delete "$V_{REC}$" and insert --$V_{REC}^1$--.

Col. 13, line 25, delete "$V_{REF}$" and insert --$V_{REF}^1$--.

Col. 13, line 26, delete "$V_{REF}$" and insert --$V_{REF}^1$--.

Col. 13, line 29, delete "$V_{REC}$" and insert --$V_{REC}^1$--

UNITED STATES PATENT AND TRADEMARK OFFICE
CERTIFICATE OF CORRECTION

PATENT NO. : 5,072,195
DATED : December 10, 1991
INVENTOR(S) : Andrew C. Graham, et al.

It is certified that error appears in the above-identified patent and that said Letters Patent is hereby corrected as shown below:

Col. 13, line 34, delete "$V_{REC}$" and insert --$V_{REC}'$--.

Col. 13, line 35, delete "$V_{REC}$" and insert --$V_{REC}'$--.

Col. 19, line 67, Claim 12, delete ";" and insert --.--.

Signed and Sealed this

Third Day of August, 1993

Attest:

MICHAEL K. KIRK

Attesting Officer

Acting Commissioner of Patents and Trademarks